United States Patent
Fukuzawa et al.

(10) Patent No.: US 7,808,414 B2
(45) Date of Patent: Oct. 5, 2010

(54) A/D CONVERSION CIRCUIT AND ELECTRONIC INSTRUMENT

(75) Inventors: Akihiro Fukuzawa, Hino (JP); Nobuyuki Imai, Shiojiri (JP); Satoru Ito, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 119 days.

(21) Appl. No.: 12/343,796

(22) Filed: Dec. 24, 2008

(65) Prior Publication Data

US 2009/0160693 A1 Jun. 25, 2009

(30) Foreign Application Priority Data

Dec. 25, 2007 (JP) ............................. 2007-331489

(51) Int. Cl.
*H03M 3/00* (2006.01)
(52) U.S. Cl. .................. 341/143; 341/118; 341/120; 341/155; 341/172
(58) Field of Classification Search ......... 341/118–122, 341/143, 155–172
See application file for complete search history.

(56) References Cited

U.S. PATENT DOCUMENTS

| | | | |
|---|---|---|---|
| 5,068,660 A * | 11/1991 | Swanson et al. | 341/143 |
| 5,568,142 A * | 10/1996 | Velazquez et al. | 341/126 |
| 5,704,368 A | 1/1998 | Asano et al. | |
| 6,249,237 B1 * | 6/2001 | Prater | 341/143 |
| 6,329,939 B1 * | 12/2001 | Swaminathan et al. | 341/143 |
| 6,396,428 B1 * | 5/2002 | Cheng | 341/143 |
| 6,693,572 B1 * | 2/2004 | Oliaei et al. | 341/143 |
| 6,836,228 B1 * | 12/2004 | Levinson et al. | 341/136 |
| 7,215,269 B2 * | 5/2007 | Lee et al. | 341/143 |
| 7,352,311 B2 * | 4/2008 | Miller et al. | 341/143 |
| 7,423,573 B2 * | 9/2008 | Baginski et al. | 341/150 |
| 7,532,137 B2 * | 5/2009 | Doerrer | 341/143 |

FOREIGN PATENT DOCUMENTS

| | | |
|---|---|---|
| JP | A-08-000585 | 1/1996 |
| JP | A-2007-117586 | 5/2007 |
| JP | A-2007-285745 | 11/2007 |

OTHER PUBLICATIONS

U.S. Appl. No. 12/338,547, filed Dec. 18, 2008, in the name of Akihiro Fukuzawa et al.

* cited by examiner

*Primary Examiner*—Linh V Nguyen
(74) *Attorney, Agent, or Firm*—Oliff & Berridge, PLC

(57) ABSTRACT

An A/D conversion circuit includes a continuous-time filter that performs a filtering process on an input signal, an SCF that is provided in a subsequent stage of the continuous-time filter and performs a filtering process utilizing the continuous-time filter as a prefilter, a cut-off frequency of the SCF being variably set corresponding to a frequency band of the input signal, an A/D converter that is provided in a subsequent stage of the SCF and performs an A/D conversion operation utilizing the continuous-time filter and the SCF as prefilters, and a digital filter that is provided in a subsequent stage of the A/D converter and performs a digital filtering process utilizing the continuous-time filter and the SCF as prefilters, a cut-off frequency of the digital filter being variably set corresponding to the frequency band of the input signal.

15 Claims, 21 Drawing Sheets

FIG. 8

| INPUT SIGNAL | RC FILTER | SCF | | DIGITAL FILTER | |
|---|---|---|---|---|---|
| | fc0 | fc1 | fck1 | fc2 | fck2 |
| 1 | f0 | f11 | fs1 | 1 | fs21 |
| 2 | f0 | f11 | fs1 | 2 | fs21 |
| 4 | f0 | f11 | fs1 | 4 | fs21 |
| 8 | f0 | f11 | fs1 | 8 | fs21 |
| 16 | f0 | f12 | fs1 | 16 | fs22 |
| 32 | f0 | f12 | fs1 | 32 | fs22 |
| 64 | f0 | f13 | fs1 | 64 | fs23 |
| 128 | f0 | f13 | fs1 | 128 | fs23 |
| 256 | f0 | f13 | fs1 | 256 | fs24 |
| 512 | f0 | f13 | fs1 | 512 | fs24 |
| 1024 | f0 | f13 | fs1 | 1024 | — |
| 4000(f14) | f0 | f14 | — | — | — |
| 8000(f15) | f0 | f15 | — | — | — |
| 16000(f0) | f0 | — | — | — | — |

FIXED ↗ G1    VARIABLE ↗ G2    FIXED ↗ G3    VARIABLE ↗ G4    VARIABLE ↗ G5

FIG. 9

| fck2 | fc2 | | | | |
|---|---|---|---|---|---|
| fs21 | (1) | (2) | (4) | (8) | (16) |
| fs22 | 4 | 8 | 16 | (32) | (64) |
| fs23 | 16 | 32 | 64 | (128) | (256) |
| fs24 | 64 | 128 | 256 | (512) | (1024) |

FIG. 11

| RC FILTER | SCF | | DIGITAL FILTER | |
|---|---|---|---|---|
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f11 | fs1 | 16 | fs21 |
| f0 | f12 | fs1 | 32 | fs22 |
| f0 | f12 | fs1 | 64 | fs22 |
| f0 | f13 | fs1 | 128 | fs23 |
| f0 | f13 | fs1 | 256 | fs23 |
| f0 | f13 | fs1 | 512 | fs24 |
| f0 | f14 | fs1 | 1024 | fs24 |
| f0 | f15 | — | — | — |
| f0 | — | — | — | — |

☆ → fc2 = 1Hz DURING CUTOFF,
A/D CONVERTER fck1' = fs1 = 128KHz,
DIGITAL FILTER fck2 = fs21 = 2KHz,
A/D CONVERTER INTERMITTENTLY
OPERATES EVERY fck1' / fck2 = 64 TIMINGS

FIG. 12

| RC FILTER | SCF | | DIGITAL FILTER | |
|---|---|---|---|---|
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f12 | fs1 | 16 | fs22 |
| f0 | f12 | fs1 | 32 | fs22 |
| f0 | f13 | fs1 | 64 | fs23 |
| f0 | f13 | fs1 | 128 | fs23 |
| f0 | f13 | fs1 | 256 | fs24 |
| f0 | f13 | fs1 | 1024 | fs24 |
| f0 | f14 | fs1 | — | — |
| f0 | f15 | — | — | — |
| f0 | — | — | — | — |

☆ → fc2 = 256Hz DURING CUTOFF, A/D CONVERTER fck1' = fs1 = 128KHz, DIGITAL FILTER fck2 = fs23 = 32KHz, A/D CONVERTER INTERMITTENTLY OPERATES EVERY fck1' / fck2 = 4TIMINGS

FIG. 13

| RC FILTER | SCF | | DIGITAL FILTER | |
|---|---|---|---|---|
| fc0 | fc1 | fck1 | fc2 | fck2 |
| f0 | f11 | fs1 | 1 | fs21 |
| f0 | f11 | fs1 | 2 | fs21 |
| f0 | f11 | fs1 | 4 | fs21 |
| f0 | f11 | fs1 | 8 | fs21 |
| f0 | f11 | fs1 | 16 | fs21 |
| f0 | f12 | fs1 | 32 | fs22 |
| f0 | f12 | fs1 | 64 | fs22 |
| f0 | f13 | fs1 | 128 | fs23 |
| f0 | f13 | fs1 | 256 | fs23 |
| f0 | f13 | fs1 | 512 | fs24 |
| f0 | f13 | fs1 | 1024 | fs24 |
| f0 | f14 | fs1 | — | — |
| f0 | f15 | fs1 | — | — |
| f0 | — | — | — | — |

☆ → fc2 = 512Hz DURING CUTOFF, A/D CONVERTER fck1' = fs1 = 128KHz, DIGITAL FILTER fck2 = fs24 = 128KHz, A/D CONVERTER NORMALLY OPERATES

US 7,808,414 B2

A/D CONVERSION CIRCUIT AND ELECTRONIC INSTRUMENT

Japanese Patent Application No. 2007-331489 filed on Dec. 25, 2007, is hereby incorporated by reference in its entirety.

BACKGROUND

The present invention relates to an A/D conversion circuit, an electronic instrument, and the like.

In order to implement a ubiquitous network society, a sensor network that is formed by connecting a plurality of sensors through a network and acquires information from each sensor to comprehensively determine the situation is necessary. Such a sensor network utilizes various sensors such as a thermosensor, a smoke sensor, an optical sensor, a human detection sensor, a pressure sensor, a biosensor, and a gyrosensor. A sensor detection signal differs in frequency band corresponding to the type of sensor.

Since the sensor detection signal (sensor signal) is an analog signal, it is necessary to convert the analog sensor detection signal into digital data in order to analyze and determine information using a CPU or the like. Therefore, an A/D conversion circuit (analog front-end circuit) that converts an analog detection signal output from a sensor into digital data is used. For example, JP-A-2007-117586 and JP-A-2007-285745 disclose related-art A/D conversion circuits.

An A/D conversion circuit has been generally developed as a sensor-specific IC. Therefore, when a new sensor has been developed, an A/D conversion circuit IC used for the new sensor must be developed and produced by way of trial. This process is very expensive. In this case, a general-purpose A/D conversion circuit IC may be used. However, since a sensor detection signal differs in frequency band, it is difficult to deal with a new sensor using a general-purpose A/D conversion circuit IC. Therefore, the user cannot easily produce an IC for various sensors by way of trial.

SUMMARY

According to one aspect of the invention, there is provided an A/D conversion circuit comprising:

a continuous-time filter that performs a filtering process on an input signal;

a switched-capacitor filter that is provided in a subsequent stage of the continuous-time filter and performs a filtering process utilizing the continuous-time filter as a prefilter, a cut-off frequency of the switched-capacitor filter being variably set corresponding to a frequency band of the input signal;

an A/D converter that is provided in a subsequent stage of the switched-capacitor filter and performs an A/D conversion operation utilizing the continuous-time filter and the switched-capacitor filter as prefilters; and a digital filter that is provided in a subsequent stage of the A/D converter and performs a digital filtering process utilizing the continuous-time filter and the switched-capacitor filter as prefilters, a cut-off frequency of the digital filter being variably set corresponding to the frequency band of the input signal.

According to another aspect of the invention, there is provided an electronic instrument comprising the above A/D conversion circuit.

BRIEF DESCRIPTION OF THE DRAWINGS

FIG. 8 shows a setting example of the cut-off frequency and the sampling frequency of each filter.

FIG. 9 shows the relationship between the sampling frequency and the cut-off frequency of a digital filter.

FIG. 11 is a view illustrative of frequency setting during an intermittent operation of an A/D converter.

FIG. 12 is a view illustrative of frequency setting during an intermittent operation of an A/D converter.

FIG. 13 is a view illustrative of frequency setting during an intermittent operation of an A/D converter.

DESCRIPTION OF EXEMPLARY EMBODIMENTS

Figure 1:
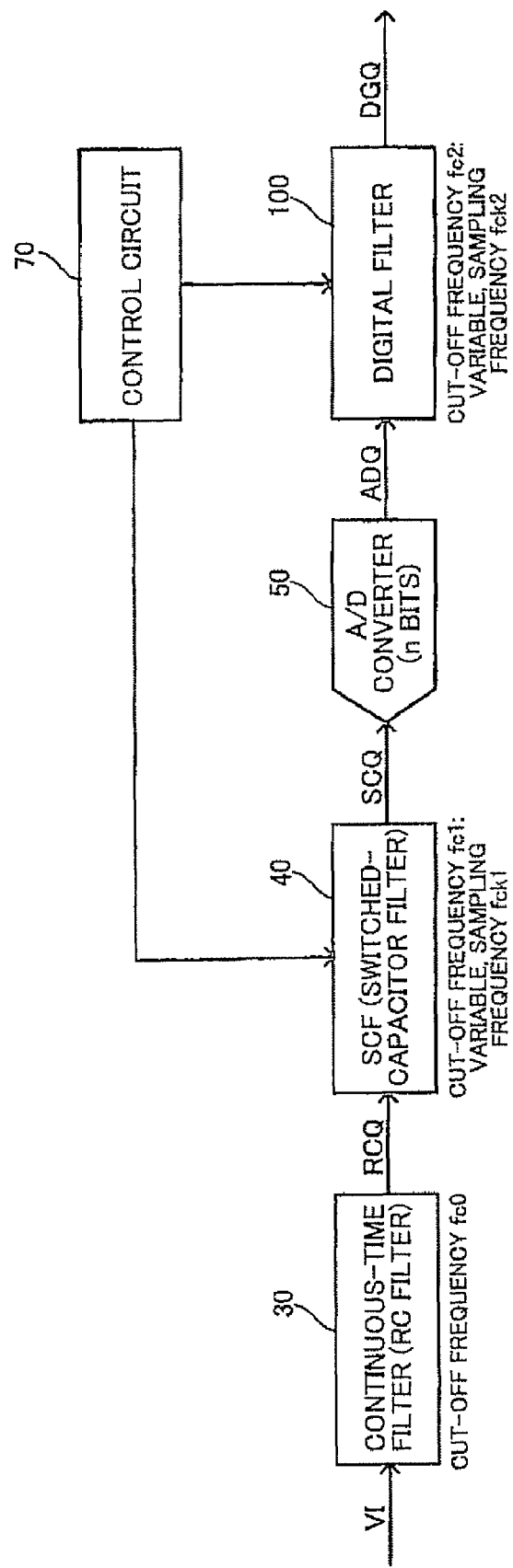
FIG. 1 shows a configuration example of an A/D conversion circuit according to one embodiment of the invention.

Several aspects of the invention may provide an A/D conversion circuit that can deal with input signals in various frequency bands, and an electronic instrument including the same.

According to one embodiment of the invention, there is provided an A/D conversion circuit comprising:

a continuous-time filter that performs a filtering process on an input signal;

a switched-capacitor filter that is provided in a subsequent stage of the continuous-time filter and performs a filtering process utilizing the continuous-time filter as a prefilter, a cut-off frequency of the switched-capacitor filter being variably set corresponding to a frequency band of the input signal;

an A/D converter that is provided in a subsequent stage of the switched-capacitor filter and performs an A/D conversion operation utilizing the continuous-time filter and the switched-capacitor filter as prefilters; and a digital filter that is provided in a subsequent stage of the A/D converter and performs a digital filtering process utilizing the continuous-time filter and the switched-capacitor filter as prefilters, a cut-off frequency of the digital filter being variably set corresponding to the frequency band of the input signal.

According to this embodiment, the switched-capacitor filter is provided in the subsequent stage of the continuous-time filter, the A/D converter is provided in the subsequent stage of the switched-capacitor filter, and the digital filter is provided in the subsequent stage of the A/D converter. The switched-capacitor filter performs the filtering process utilizing the continuous-time filter as a prefilter, and The digital filter performs the filtering process utilizing the continuous-time filter and the switched-capacitor filter as prefilters. The cut-off frequencies of the switched-capacitor filter and the digital filter are variably set corresponding to the frequency band of the input signal. Therefore, an A/D conversion circuit that can deal with input signals in various frequency bands can be provided.

The A/D conversion circuit may further comprise:

a control circuit that variably sets the cut-off frequency of the switched-capacitor filter and the cut-off frequency of the digital filter.

According to this configuration, the cut-off frequencies of the switched-capacitor filter and the digital filter can be arbitrarily set under control of the control circuit.

In the A/D conversion circuit, when a cut-off frequency of the continuous-time filter is referred to as fc0, the cut-off frequency of the switched-capacitor filter is referred to as fc1, and the cut-off frequency of the digital filter is referred to as fc2, the relationship fc0>fc1>fc2 may be satisfied.

According to this configuration, a variable filter function that deals with input signals in various frequency bands can be implemented by a small configuration.

In the A/D conversion circuit, when a sampling frequency of the switched-capacitor filter is referred to as fck1, the cut-off frequency of the switched-capacitor filter is referred to as fc1, a resolution of the A/D converter is n bits, and an attenuation factor of the continuous-time filter at a frequency fck1-fc1 is AT1 dB, the relationship $AT1 \leq 20 \times \log(\frac{1}{2}^n)$ may be satisfied.

According to this configuration, a harmonic signal that causes a folding noise due to the switched-capacitor filter can be attenuated to a voltage equal to or lower than the voltage corresponding to the 1LSB of the A/D converter, for example.

In the A/D conversion circuit, when a sampling frequency of the digital filter is referred to as fck2, the cut-off frequency of the digital filter is referred to as fc2, and a resultant attenuation factor of the continuous-time filter and the switched-capacitor filter at a frequency fck2-fc2 is AT2 dB, the relationship $AT2 \leq 20 \times \log(\frac{1}{2}^n)$ may be satisfied.

According to this configuration, a harmonic signal that causes a folding noise due to the digital filter can be attenuated to a voltage equal to or lower than the voltage corresponding to the 1LSB of the A/D converter, for example.

In the A/D conversion circuit, a cut-off frequency fc0 of the continuous-time filter may be fixed; and the cut-off frequency fc1 of the switched-capacitor filter and the cut-off frequency fc2 of the digital filter may be variably set.

It is unnecessary to provide external elements by fixing the cut-off frequency fc0 so that convenience can be improved.

In the A/D conversion circuit, a sampling frequency fck1 of the switched-capacitor filter may be fixed; and the cut-off frequency fc1 of the switched-capacitor filter may be variably set.

Since the frequency in the folding band does not change by fixing the sampling frequency fck1, the filter frequency characteristics can be easily designed.

In the A/D conversion circuit, the cut-off frequency fc1 of the switched-capacitor filter may be variably set by changing a capacitance ratio of a plurality of capacitors included in the switched-capacitor filter.

According to this configuration, the cut-off frequency fc1 can be variably set while suppressing an increase in circuit scale.

In the A/D conversion circuit, a sampling frequency fck2 and the cut-off frequency fc2 of the digital filter may be variably set.

According to this configuration, filter characteristics corresponding to the frequency band of the input signal can be implemented.

In the A/D conversion circuit, the sampling frequency fck2 of the digital filter may be set so that the sampling frequency fck2 decreases as the cut-off frequency fc1 of the switched-capacitor filter decreases.

According to this configuration, the sampling frequency fck2 of the digital filter can be reduced by reducing the cut-off frequency fc1 of the switched-capacitor filter corresponding to the frequency band of the input signal, for example. Therefore, unnecessary power consumption and the like can be prevented.

In the A/D conversion circuit, the cut-off frequency fc2 of the digital filter may be set so that the cut-off frequency fc2 decreases as the frequency band of the input signal decreases.

According to this configuration, even when the frequency band of the input signal is low, it is possible to deal with the input signal by reducing the cut-off frequency fc2 of the digital filter.

In the A/D conversion circuit, when a sampling frequency of the A/D converter is referred to as fck1', a sampling frequency fck2 of the digital filter may be variably set in such a range that the relationship fck1'≧fck2 is satisfied.

According to this configuration, the intermittent operation of the A/D converter can be implemented, for example.

In the A/D conversion circuit, the A/D converter intermittently may perform the A/D conversion operation every (fck1'/fck2) timings when fck1'>fck2, and may output digital data obtained by the intermittent A/D conversion operations to the digital filter.

Since the A/D converter operates intermittently, the operation of the A/D converter can be stopped or a signal of another channel can be subjected to A/D conversion in a period after the A/D converter has performed the A/D conversion operation.

The A/D conversion circuit may further comprise:

an amplifier circuit that includes a plurality of amplifiers that are cascaded, the amplifier circuit being provided in a preceding stage of the switched-capacitor filter and receiving the input signal, the continuous-time filter may be formed by the plurality of amplifiers of the amplifier circuit.

According to this configuration, a continuous-time filter (prefilter) can be implemented by effectively utilizing the amplifier circuit that amplifies the input signal.

According to anther embodiment of the invention, there is provided an electronic instrument comprising one of the above A/D conversion circuits.

Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Configuration of A/D Conversion Circuit

FIG. 1 shows a configuration example of an A/D conversion circuit (A/D conversion device or analog front-end circuit) according to one embodiment of the invention. The A/D conversion circuit includes a continuous-time filter 30, a switched-capacitor filter (SCF) 40, an A/D converter 50, and a digital filter 100. The A/D conversion circuit may also include a control circuit 70. Note that the A/D conversion circuit is not limited to the configuration shown in FIG. 1. Various modifications may be made such as omitting some (e.g., control circuit) of the elements or adding other elements (e.g., digital processing section and selector).

The continuous-time filter 30 performs a filtering process on an input signal VI. Specifically, the continuous-time filter 30 performs an Nth-order (N is a natural number) low-pass filtering (LPF) process on the input signal VI. In this case, the cut-off frequency of the continuous-time filter 30 is set at fc0.

The continuous-time filter 30 does not produce a folding noise, differing from the SCF 40 and the digital filter 100 that are discrete-time filters. The continuous-time filter 30 may be a passive filter that includes passive elements such as a resistor, a capacitor, and an inductor, or may be an active filter that includes one or more amplifiers. The amplifier of the active filter may be formed by passive elements (e.g., resistor and capacitor) and an operational amplifier, for example.

The SCF 40 (switched-capacitor filter) is provided in the subsequent stage of the continuous-time filter 30. Specifically, the SCF 40 receives an output signal RCQ from the continuous-time filter 30, performs a filtering process (e.g., LPF process) oil the output signal RCQ, and outputs a signal SCQ obtained by the filtering process to the A/D converter 50. The SCF 40 includes a switch element, an operational amplifier, and a capacitor. The SCF 40 performs a sample-hold operation at a sampling frequency fck1.

The SCF 40 performs the filtering process utilizing the continuous-time filter 30 as a prefilter (anti-aliasing filter). Specifically, the SCF 40 performs a filtering process that prevents a folding noise that occurs when a harmonic signal folds into the frequency band of the input signal VI from exceeding the voltage (quantization error voltage) corresponding to the 1 LSB of the A/D converter 50.

The cut-off frequency fc1 of the SCF 40 (first discrete-time filter in a broad sense) is variably set corresponding to the frequency band (passband) of the input signal VI, for example. For example, the cut-off frequency fc1 of the SCF 40 decreases as the frequency band (passband cut-off frequency) of the input signal VI decreases.

The A/D converter 50 is provided in the subsequent stage of the SCF 40. Specifically, the A/D converter 50 receives the output signal SCQ from the SCF 40, A/D-converts the output signal SCQ, and outputs digital data ADQ obtained by A/D conversion to the digital filter 100. The A/D converter 50 performs the A/D conversion operation utilizing the continuous-time filter 30 and the SCF 40 as prefilters.

A high-potential-side reference voltage and a low-potential-side reference voltage that specify (set) an input voltage range are supplied to the A/D converter 50. The A/D converter 50 A/D-converts the output signal SCQ at a resolution of n bits (e.g., n=10) in the input voltage range specified by the high-potential-side reference voltage and the low-potential-side reference voltage, and outputs the digital data ADQ (digital output value) obtained by A/D conversion. For example, the A/D converter 50 samples/holds the output signal SCQ using an A/D conversion sampling clock signal, and A/D-converts the sampled/held signal.

A successive approximation type A/D converter may be used as the A/D converter 50, for example. In this case, the A/D converter 50 may include a sample-hold circuit, a comparator, a successive approximation register, and a D/A converter (not shown). The comparator compares a D/A-converted analog signal output from the D/A converter with a sampled/held signal output from the sample-hold circuit. The successive approximation register stores data relating to an output signal from the comparator. The D/A converter D/A-converts the digital data output from the successive approximation register, and outputs the resulting analog signal. Note that the A/D converter 50 is not limited to the successive approximation type A/D converter, but may be a parallel comparison type A/D converter, a servo-balancing type A/D converter, or the like.

The digital filter 100 is provided in the subsequent stage of the A/D converter 50. Specifically, the digital filter 100 receives the digital data ADQ from the A/D converter 50, performs a digital filtering process (e.g., LPF process) on the digital data ADQ, and outputs digital data DGQ obtained by the digital filtering process.

The digital filter 100 performs the filtering process utilizing the continuous-time filter 30 and the SCF 40 as prefilters. As the digital filter 100, an infinite impulse response (IIR) filter or a finite impulse response (FIR) filter may be used.

The cut-off frequency fc2 of the digital filter 100 (second discrete-time filter in a broad sense) is variably set corresponding to the frequency band (passband) of the input signal VI, for example. For example, the cut-off frequency fc2 of the digital filter 100 decreases as the frequency band of the input signal VI decreases. The sampling frequency fck2 of the digital filter 100 is also variably set.

The control circuit 70 controls each circuit of the A/D conversion circuit, for example. Specifically, the control circuit 70 variably sets (controls) the cut-off frequency fc1 of the SCF 40 and the cut-off frequency fc2 of the digital filter 100. The control circuit 70 may also variably set the sampling frequency fck2 of the digital filter 100.

More specifically, the control circuit 70 includes an internal register for setting the cut-off frequency (e.g., fc1 and fc2) and the sampling frequency (e.g., fck2). The cut-off frequency and the sampling frequency are set in the internal register from an external instrument (e.g., software or firmware that controls an electronic instrument) through an interface (not shown). The control circuit 70 then instructs the SCF 40 and the digital filter 100 to set the cut-off frequency and the sampling frequency based on the information set in the internal register. The SCF 40 and the digital filter 100 perform the filtering process corresponding to the cut-off frequency and the sampling frequency.

The above-described A/D conversion circuit according to this embodiment enables the filter band to be variably set. Specifically, the cut-off frequency of the filter is variably set corresponding to the frequency band (passband cut-off frequency) of the input signal VI.

In a related-art A/D conversion circuit, the frequency band of the input signal has been determined to a certain extent corresponding to the specification and the like. Therefore, it suffices that the A/D conversion circuit A/D-convert an input signal in a frequency band corresponding to the specification.

However, when subjecting a detection signal output from a sensor (sensor device) or the like to A/D conversion, the frequency band of the detection signal differs corresponding to the type of sensor. Therefore, it is difficult to A/D-convert the sensor detection signals in various frequency bands using a related-art A/D conversion circuit in which the frequency band of the input signal has been determined corresponding the specification and the like. Therefore, when developing and producing a new sensor by way of trial, it is necessary to develop an A/D conversion circuit corresponding to each sensor. This increases the development cost and the development period.

The A/D conversion circuit according to this embodiment is configured so that the cut-off frequency of the filter is variably set corresponding to the frequency band of the input signal VI. Specifically, the cut-off frequency fc1 of the SCF 40 and the cut-off frequency fc2 of the digital filter 100 are variably set corresponding to the frequency band of the input signal VI. Therefore, since the cut-off frequency can be variably set in the range from 1 Hz to 16 KHz, for example, it is possible to deal with the input signals VI in various frequency bands. As a result, a novel A/D conversion circuit can be provided.

According to the related-art technology, it is difficult to deal with a first type of sensor that outputs a detection signal having a frequency of 1 Hz and a second type of sensor that outputs a detection signal having a frequency of 16 KHz using one A/D conversion circuit, for example. This makes it necessary to separately develop an A/D conversion circuit (IC) for the first type of sensor and an A/D conversion circuit (IC) for the second type of sensor.

On the other hand, since the A/D conversion circuit according to this embodiment has a variable filter function, it is possible to deal with the first type of sensor and the second type using one A/D conversion circuit. Therefore, an increase in development cost and development period can be prevented. Moreover, the user can connect the sensor to the A/D conversion circuit without taking the frequency band of the detection signal into much consideration. Therefore, a user-friendly A/D conversion circuit can be provided.

According to this embodiment, the continuous-time filter 30 functions as a prefilter for the SCF 40, and the continuous-time filter 30 and the SCF 40 function as prefilters for the digital filter 100 (and the A/D converter 50). This implements a variable band in a wide range from 1 Hz to 16 KHz, for example.

As a comparative example of this embodiment, only the continuous-time filter 30 may be provided as a prefilter for the digital filter 100 without providing the SCF 40. According to the comparative example, when using an RC filter as the continuous-time filter 30, the cut-off frequency of the continuous-time filter 30 is determined by the reciprocal of an RC product that is the product of the resistance and the capacitance. Therefore, it is necessary to increase the resistance and the capacitance in order to deal with various frequency bands. This makes it difficult to incorporate the resistor and the capacitor in an IC chip. As a result, the resistor and the capacitor must be provided externally.

According to this embodiment, the SCF 40 is provided between the continuous-time filter 30 and the A/D converter 50. The cut-off frequency fc1 of the SCF 40 and the cut-off frequency fc2 of the digital filter 100 are variably set. Therefore, the filter characteristics of the entire system can be variably set corresponding to the input signals VI in various frequency bands. The cut-off frequency fc1 of the SCF 40 is variably set by changing the capacitance ratio of a plurality of capacitors (described later) (i.e., has no size dependence). Therefore, the resistor and the capacitor can be easily incorporated in an IC chip as compared with the method that sets the cut-off frequency using only the continuous-time filter 30 (RC filter).

2. Frequency Characteristics

The details of the frequency characteristics of the variable filter implemented by the A/D conversion circuit according to this embodiment are described below. The continuous-time filter 30 shown in FIG. 1 is hereinafter referred to as an RC filter 30 for convenience of description.

Figure 2:
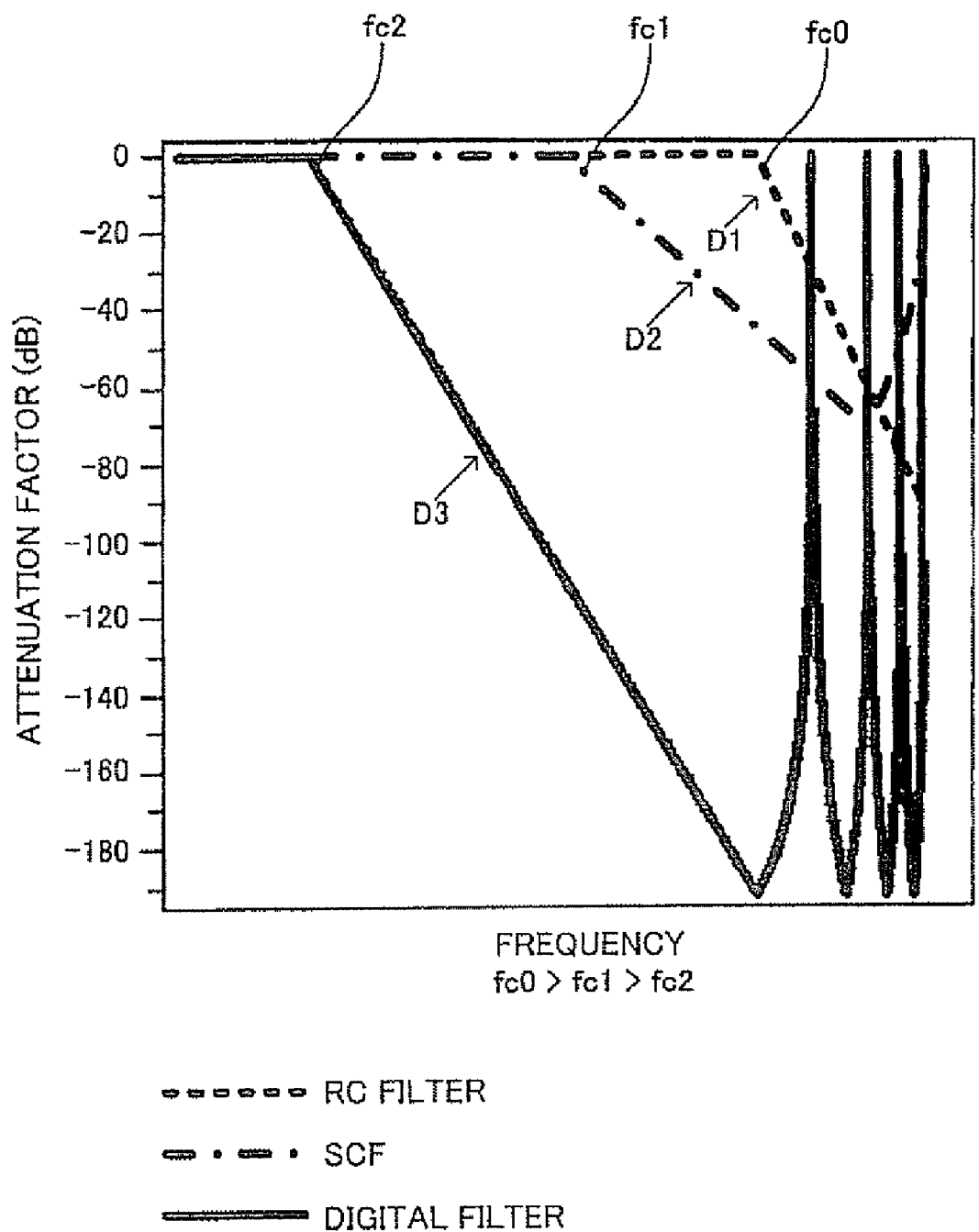
FIG. 2 shows an example of the frequency characteristics of each filter when the frequency axis is a LOG axis.

D1, D2, and 93 shown in FIG. 2 indicate examples of the frequency characteristics of the attenuation factors of the RC filter 30, the SCF 40, and the digital filter 100, respectively. When the cut-off frequency of the RC filter 30 (D1) is fc0, the cut-off frequency of the SCF 40 (92) is fc1, and the cut-off frequency of the digital filter 100 (D3) is fc2, the relationship fc0>fc1>fc2 is satisfied, for example. The variable filter function of the A/D conversion circuit that deals with input signals in various frequency bands can be implemented by a small circuit configuration by satisfying the above-mentioned cut-off frequency relationship.

Figure 3:
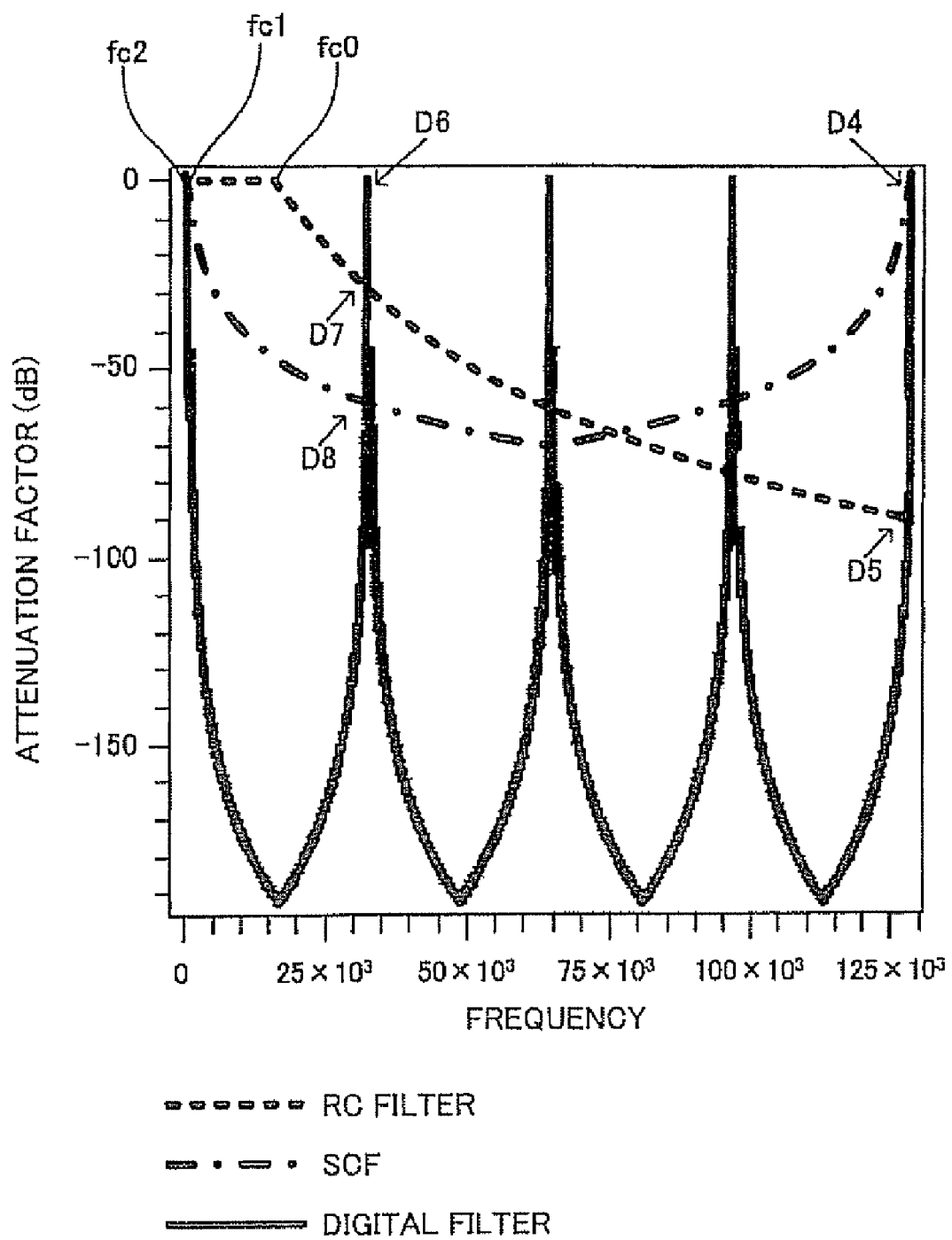
FIG. 3 shows an example of the frequency characteristics of each filter when the frequency axis is a linear axis.

In FIG. 2, the frequency axis is indicated by a LOG axis, for example. In FIG. 3, the frequency axis is indicated by a linear axis.

Since the SCF 40 is a discrete-time filter, a harmonic signal passes through the SCF 40 near the sampling frequency fck1 of the SCF 40 due to anti-aliasing (see D4 in FIG. 3) so that a folding noise occurs.

According to this embodiment, the RC filter 30 functions as a prefilter for the SCF 40. Therefore, a harmonic signal that causes a folding noise can be attenuated to a voltage equal to or lower than the voltage corresponding to the 1LSB of the A/D converter 50 (equal to or less than a quantization error) due to the attenuation characteristics of the RC filter 30 (see D5 in FIG. 3), for example.

Since the digital filter 100 is a discrete-time filter, a harmonic signal passes through the digital filter 100 near the sampling frequency fck2 (folding band) of the digital filter 100 due to anti-aliasing (see D6 in FIG. 3) so that a folding noise occurs.

According to this embodiment, the RC filter 30 and the SCF 40 function as prefilters for the digital filter 100. Therefore, a harmonic signal that causes a folding noise can be attenuated to a voltage equal to or lower than the voltage corresponding to the 1LSB of the A/D converter 50 due to the resultant attenuation characteristics of the RC filter 30 and the SCF (see D7 and D8 in FIG. 3), for example.

Figure 4:
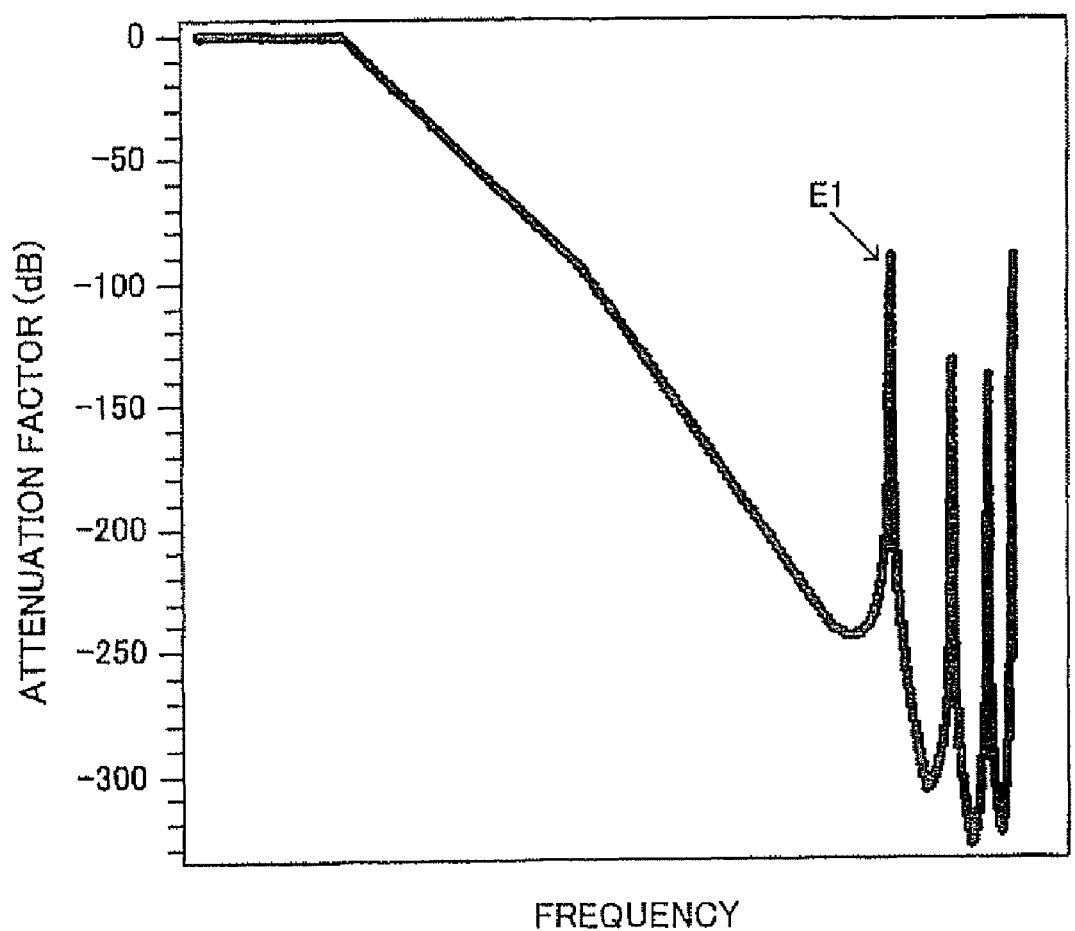
FIG. 4 shows an example of the frequency characteristics of the entire system when the frequency axis is a LOG axis.

FIG. 4 shows the frequency characteristics of the filter attenuation factor of the entire system of the A/D conversion circuit. When the number of bits of the resolution of the A/D converter 50 is n, an attenuation factor AT required to attenuate a harmonic signal to a voltage equal to or lower than the voltage corresponding to the 1LSB of the A/D converter 50 is expressed by $AT=20\times\log(\frac{1}{2}^n)$. Therefore, when n=10 bits, the attenuation factor AT is about −60 dB.

Figure 5:
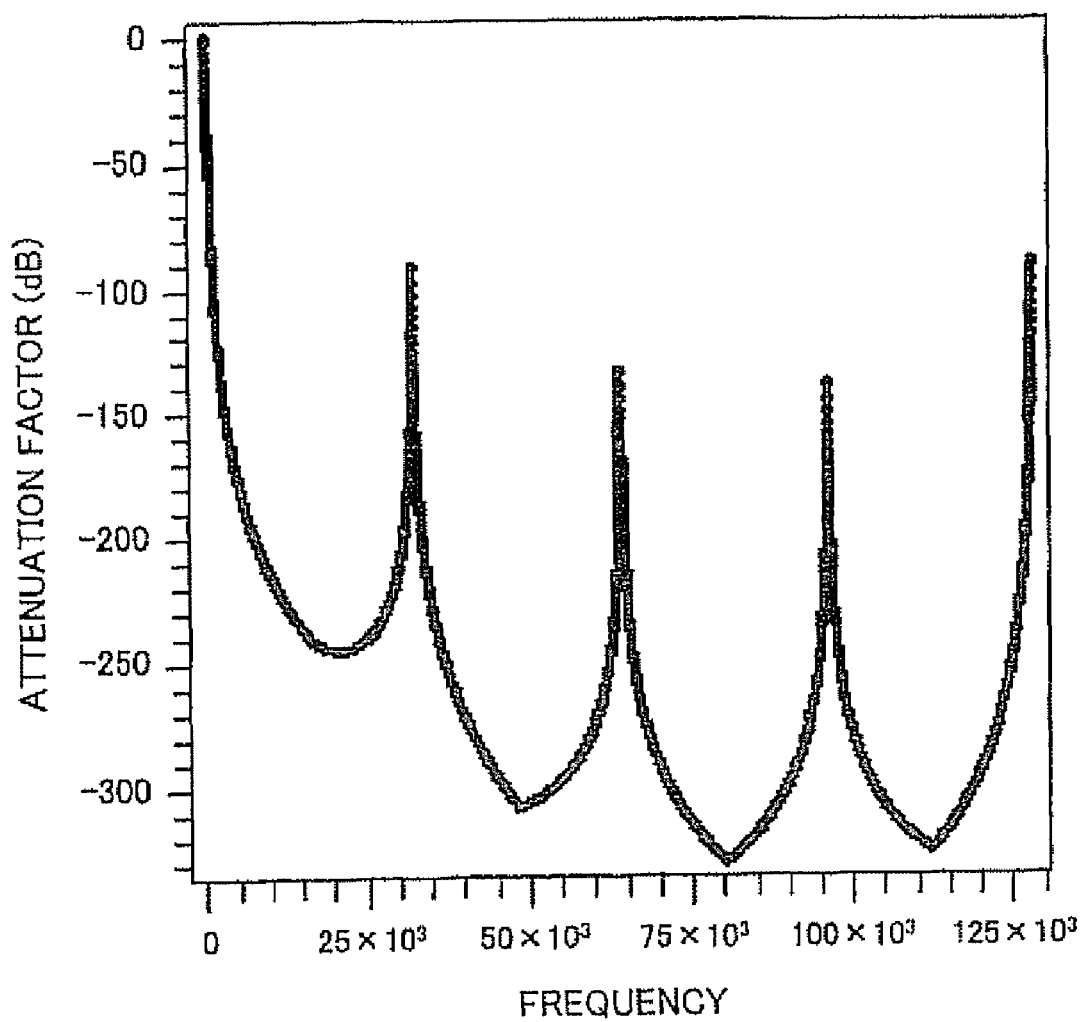
FIG. 5 shows an example of the frequency characteristics of the entire system when the frequency axis is a linear axis.

The attenuation factor of the filter at E1 in FIG. 4 is −60 dB or less (i.e., a harmonic signal is attenuated to a voltage equal to or lower than the voltage corresponding to the 1LSB of the A/D converter 50). In FIG. 4, the frequency axis is indicated by a LOG axis. In FIG. 5, the frequency axis is indicated by a linear axis.

According to this embodiment, a folding noise due to the discrete-time filter can be removed by the prefilter. Therefore, a variable filter that can deal with input signals in various frequency bands can be implemented by a small circuit scale by variably changing the cut-off frequency fc2 of the digital filter 100 corresponding to the frequency of the input signal.

For example, it suffices that the RC filter 30 remove a folding noise due to the SCF 40 (see D5 in FIG. 3). Therefore, the cut-off frequency fc0 of the RC filter 30 can be set at a high frequency (see D1 in FIG. 2). Specifically, the cut-off frequency fc0 of the RC filter 30 can be set to be sufficiently higher than the cut-off frequencies fc1 and fc2 of the SCF 40 and the digital filter 100 (fc0>fc1>fc2). The cut-off frequency fc0 is proportional to the reciprocal of the RC product. Therefore, since the cut-off frequency fc0 of the RC filter 30 can be set at a high frequency, the resistance and the capacitance of the RC filter 30 can be reduced. According to this embodiment, since the layout area of the resistor and the capacitor can be reduced due to a reduction in resistance and capacitance, the circuit scale can be reduced. Moreover, since the resistor and the capacitor need not be provided externally, convenience to the user can be improved.

According to this embodiment, since the SCF 40 is provided between the RC filter 30 and the digital filter 100, a folding noise due to the digital filter 100 can be removed by the SCF 40 (see D8 in FIG. 3). The RC filter 30 also contributes to removal of a folding noise due to the digital filter 100 (see D7). This makes it possible to set the sampling frequency fck2 of the digital filter 100 at a low frequency. Specifically, when the sampling frequency fck2 decreases, the folding band near the sampling frequency fck2 (D6) is shifted to a low frequency side. In this case, a folding noise can be sufficiently attenuated and removed due to the attenuation characteristics of the SCF 40 (see D8).

Since the sampling frequency fck2 of the digital filter 100 can be reduced, the cut-off frequency fc2 of the digital filter 100 can be set at a low frequency (see D3 in FIG. 2). Specifically, the cut-off frequency fc2 of the digital filter 100 can be set to be sufficiently lower than the cut-off frequencies fc0 and fc1 of the RC filter 30 and the SCF 40 (fc0>fc1>fc2).

Since the cut-off frequency fc2 of the digital filter 100 can be reduced, the cut-off frequency fc2 can be set corresponding to the frequency band of the input signal.

For example, when the frequency band of the input signal is low (e.g., 0 to 1 Hz), it is possible to deal with the input signal in such a low frequency band by setting the cut-off frequency fc2 of the digital filter 100 at 1 Hz, for example.

When the frequency band of the input signal is 0 to 256 Hz, it is possible to deal with the input signal by setting the cut-off frequency fc2 of the digital filter 100 at 256 Hz, for example.

When the frequency band of the input signal is high (e.g., 0 to 16 KHz), the input signal is filtered using only the RC filter 30 of which the cut-off frequency fc0 is 16 KHz while disabling the filtering processes of the digital filter 100 and the SCF 40.

3. Attenuation Factor

The details of the filter attenuation factor setting method are described below with reference to FIG. 6. At F1 in FIG. 6, fck1 and fc1 respectively indicate the sampling frequency and the cut-off frequency of the SCF 40, and n indicates the number of bits that indicates the resolution of the A/D converter 50. AT1 (dB) indicates the attenuation factor of the RC filter 30 (continuous-time filter) at a frequency fck1-fc1. In this case, the relationship $AT1 \leq 20 \times \log(\frac{1}{2}^n)$ is satisfied.

Figure 7A:
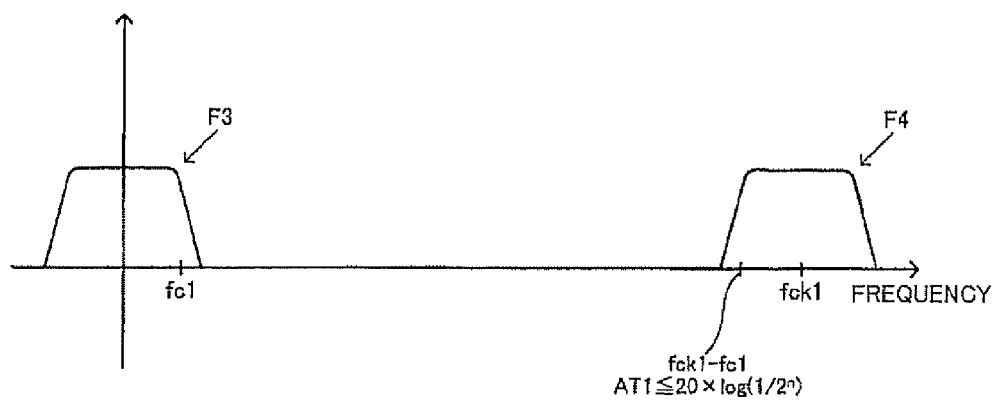
FIGS. 7A and 7B are views illustrative of an attenuation factor setting method.

Specifically, when the sampling frequency of the SCF 40 is fck1, a harmonic signal in a band fck1-fc1 to fck1+fc1 (see F4 in FIG. 7A) folds into a band 0 to fc1 (see F3) due to anti-aliasing. Therefore, in order to maintain the resolution corresponding to the 1LSB of the A/D converter 50, it is necessary to attenuate the harmonic signal by $20 \times \log(\frac{1}{2}^n)$ at least at a frequency fck1-fc1. Therefore, the attenuation factor AT1 of the RC filter 30 that functions as a prefilter for the SCF 40 is expressed by $AT1 \leq 20 \times \log(\frac{1}{2}^n)$ at a frequency fck1-fc1. For example, when n=10, the attenuation factor AT1 is equal to or smaller than −60 dB ($AT1 \leq -60$ dB).

Figure 6:
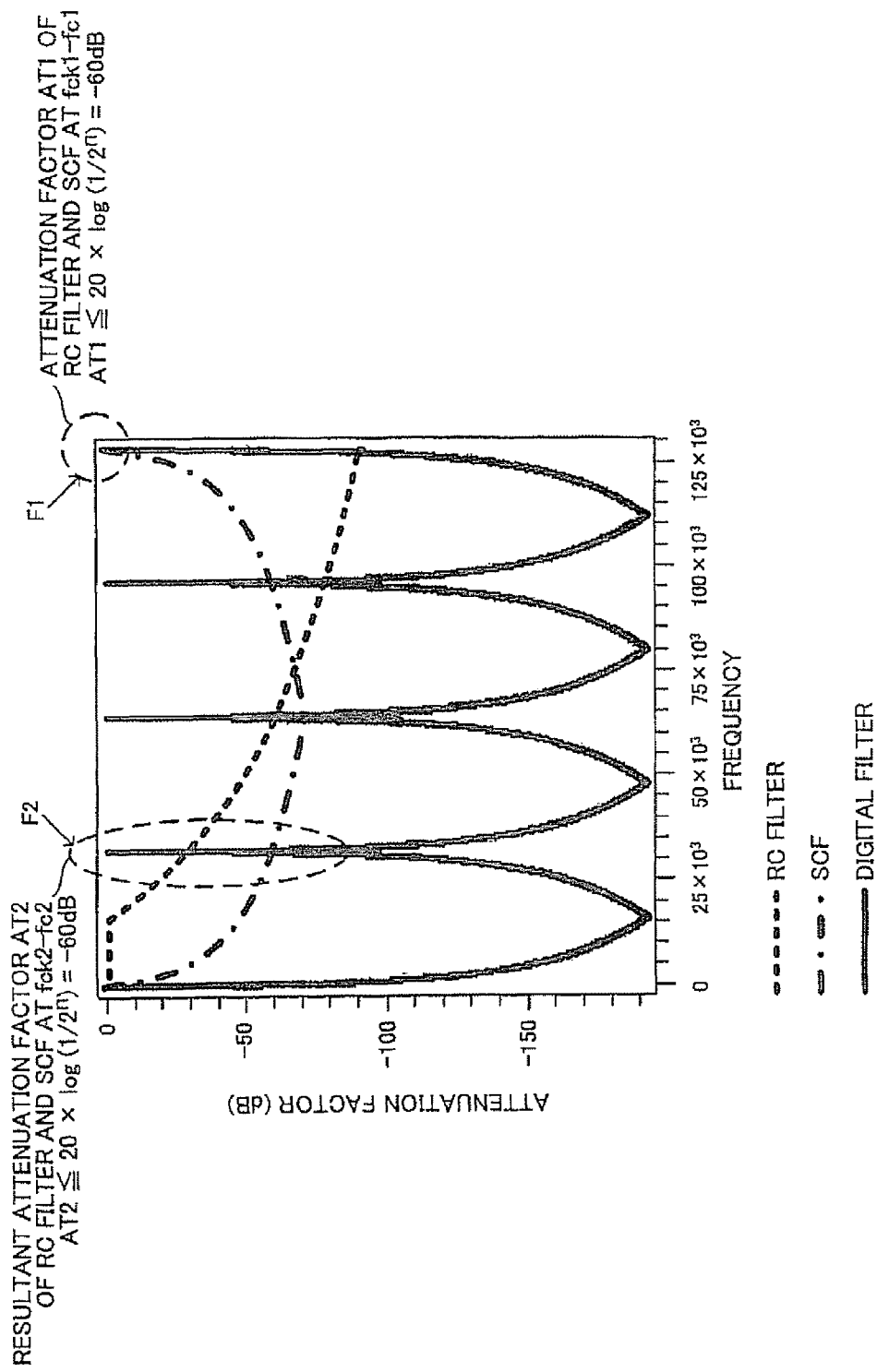
FIG. 6 is a view illustrative of an attenuation factor setting method.

At F2 in FIG. 6, fck2 and fc2 respectively indicate the sampling frequency and the cut-off frequency of the digital filter 100, and n indicates the number of bits that indicates the resolution of the A/D converter 50. AT2 (dB) indicates the resultant attenuation factor of the RC filter 30 and the SCF 40 at a frequency fck2-fc2. In this case, the relationship $AT2 \leq 20 \times \log(\frac{1}{2}^n)$ is satisfied.

Figure 7B:
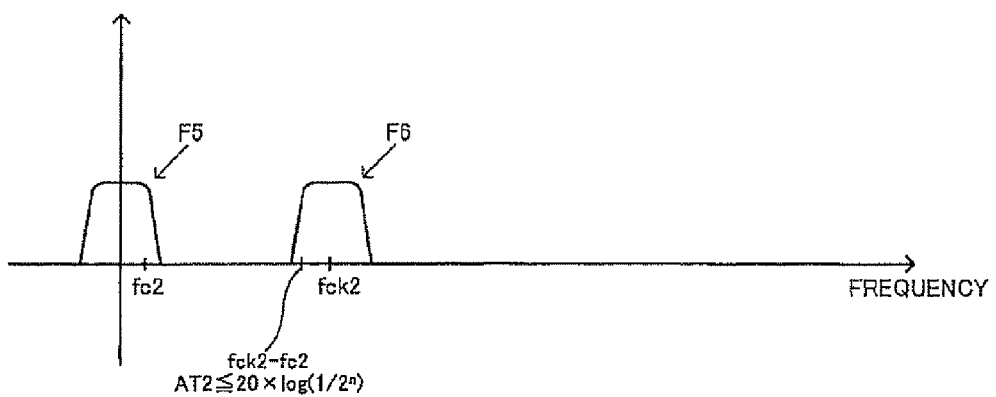

Specifically, when the sampling frequency of the digital filter 100 is fck2, a harmonic signal in a band fck2-fc2 to fck2+fc2 (see F6 in FIG. 7B) folds into a band 0 to fc2 (see F5) due to anti-aliasing. Therefore, in order to maintain the resolution corresponding to the 1LSB of the A/D converter 50, it is necessary to attenuate the harmonic signal by $20 \times \log(\frac{1}{2}^n)$ at least at a frequency fck2-fc2. Therefore, the resultant attenuation factor AT2 of the SCF 40 and the RC filter 30 that function as prefilters for the digital filter 100 is expressed by $AT2 \leq 20 \times \log(\frac{1}{2}^n)$ at a frequency fck2-fc2. For example, when n=10, the attenuation factor AT2 is equal to or smaller than −60 dB ($AT2 \leq -60$ dB).

If the relationships indicated by F1 and F2 in FIG. 6 are satisfied, a harmonic signal can be appropriately attenuated (see E1 in FIG. 4). This effectively prevents a situation in which the resolution corresponding to the 1LSB of the A/D converter 50 can not be maintained due to a folding noise.

4. Frequency Setting

The details of the cut-off frequency/sampling frequency setting method according to this embodiment is described below. FIG. 8 shows a frequency setting example.

As indicated by G1 in FIG. 8, the cut-off frequency fc0 of the RC filter 30 is fixed at f0. The frequency F0 is a frequency in the range from 10 KHz to 20 KHz, for example. It is unnecessary to externally provide a resistor and a capacitor by fixing the cut-off frequency fc0 at f0 so that convenience to the user can be improved. Note that a modification in which the cut-off frequency fc0 is variably set is also possible.

As indicated by G2 and G4 in FIG. 8, the cut-off frequency fc1 of the SCF 40 and the cut-off frequency fc2 of the digital filter 100 are variably set. Specifically, the cut-off frequency fc1 is variably set in the range from f11 to f15, for example. The frequency f11 is a frequency in the range from 10 Hz to 100 Hz, for example. The frequencies f14 and f15 are the same as the frequency of the input signal. For example, f14=4 KHz and f15=8 Hz.

The cut-off frequency fc2 of the digital filter 100 is variably set in the range from 1 Hz to 1024 Hz, for example. Specifically, the cut-off frequency fc2 is set to coincide with the frequency band of the input signal. For example, when the frequency band of the input signal is 1 Hz (0 to 1 Hz), the cut-off frequency fc2 is set at 1 Hz. When the frequency band of the input signal is 2 Hz (0 to 2 Hz), the cut-off frequency fc2 is set at 2 Hz.

When the frequency band of the input signal is 4 KHz or 8 KHz, the filtering process of the digital filter 100 is disabled, and the cut-off frequency fc1 of the SCF 40 is set at 4 KHz or 8 KHz. When the frequency band of the input signal is 16 KHz, the filtering processes of the digital filter 100 and the SCF 40 are disabled, and the cut-off frequency of the entire system is set by the cut-off frequency fc0 (=f0) of the RC filter 30.

As indicated by G2 and G3 in FIG. 8, the sampling frequency fck1 of the SCF 40 is fixed at fs1, and the cut-off frequency fc1 of the SCF 40 is variably set.

Specifically, when the sampling frequency fck1 of the SCF 40 changes, the frequency in the folding band of the SCF 40 (D4 in FIG. 3) changes. This makes it difficult to design the filter frequency characteristics. Therefore, the sampling frequency fck1 is fixed at fs1 (G3 in FIG. 8). The frequency fs1 is a frequency in the range from 50 KHz to 200 KHz, for example. The frequency fs1 is the same as the sampling frequency fck2 (=fs24) of the digital filter 100, for example. Note that a modification in which the sampling frequency fck1 is variably set is also possible.

On the other hand, the cut-off frequency fc1 of the SCF 40 is variably set (G2 in FIG. 8). Specifically, the cut-off frequency fc1 is variably set by changing the capacitance ratio of a plurality of capacitors included in the SCF 40. The cut-off frequency fc1 of the SCF 40 may be set based on the sampling frequency fck2. In this case, it is it difficult to design the filter frequency characteristics. Therefore, the sampling frequency fck1 is fixed at fs1, and the cut-off frequency fc1 is variably set by changing the capacitance ratio of the capacitors of the SCF 40 (G2 and G3 in FIG. 8).

Since the capacitance ratio of the capacitors has no size dependence, the layout area of the capacitors does not increase to a large extent even if the cut-off frequency fc1 is made variable. Therefore, the cut-off frequency can be variably set while suppressing an increase in circuit scale.

As indicated by 64 and G5 in FIG. 5, the sampling frequency fck2 and the cut-off frequency fc2 of the digital filter 100 are variably set.

Specifically, the sampling frequency fck2 of the digital filter 100 is variably set so that the sampling frequency fck2 decreases as the cut-off frequency fc1 of the SCF 40 decreases (see G2 and 65). For example, when the cut-off frequency fc1 of the SCF 40 is f11, the sampling frequency fck2 of the digital filter 100 is set at fs21. When the cut-off frequency fc1 of the SCF 40 is f12, the sampling frequency fck2 of the digital filter 100 is set at fs22. When the cut-off frequency fc1 of the SCF 40 is f13, the sampling frequency fck2 of the digital filter 100 is set at fs23 or fs24. Note that the relationship f11<f12<f13<f14<f15 and the relationship fs21<fs22<fs23<fs24 are satisfied.

As indicated by G4 in FIG. 8, the cut-off frequency fc2 of the digital filter 100 is set so that the cut-off frequency fc2 decreases as the frequency band of the input signal decreases. Specifically, when the frequency band of the input signal is 1, 2, 4, 8, 16, 32, 64, 128, 256, 512, or 1024 Hz, the cut-off frequency fc2 is also set at 1, 2, 4, 8, 16, 32, 64, 128, 256, 512, or 1024 Hz, respectively.

As shown in FIG. 9, the digital filter 100 is configured so that a given number (e.g., five) of cut-off frequencies fc2 can be set corresponding to one sampling frequency fck2, for example. In FIG. 9, the cut-off frequency fc2 can be set at 1, 2, 4, 8, and 16 Hz when the sampling frequency fck2 is fs21, and the cut-off frequency fc2 can be set at 4, 8, 16, 32, and 64 Hz when the sampling frequency fck2 is fs22. This also applies to the case where the sampling frequency fck2 is fs23 or fs24.

In FIG. 8, 1, 2, 4, 8, and 16 Hz are selected as the cut-off frequency fc2 when the sampling frequency fck2 is fs21, 32 and 64 Hz are selected as the cut-off frequency fc2 when the sampling frequency fck2 is fs22, 128 and 256 Hz are selected as the cut-off frequency fc2 when the sampling frequency fck2 is fs23, and 512 and 1024 Hz are selected as the cut-off frequency fc2 when the sampling frequency fck2 is fs24 (encircled in FIG. 9). Therefore, the cut-off frequency fc2 of the digital filter 100 can be set at a frequency corresponding to the frequency band of the input signal using the digital filter 100 having a simple and small configuration.

According to this embodiment, since the SCF 40 is used as a prefilter for the digital filter 100, a folding noise due to the digital filter 100 can be sufficiently attenuated by the SCF 40 (see D8 in FIG. 3). Therefore, the sampling frequency fck2 corresponding to the frequency in the folding band (D6) can be shifted to a low frequency side. This makes it possible to reduce the sampling frequency fck2 of the digital filter 100 so that the digital filter 100 can be operated at a low frequency.

The order of the digital filter 100 can be reduced as the frequency difference between the sampling frequency fck2 and the cut-off frequency fc2 decreases. Since the sampling frequency fck2 can be reduced, the circuit scale of the digital filter 100 can be reduced by reducing the order of the digital filter 100. Since the cut-off frequency fc2 can be reduced by reducing the sampling frequency fck2, it is possible to deal with an input signal in a frequency band as low as 1 Hz. Specifically, the cut-off frequency fc2 of the digital filter 100 can be set to deal with a low frequency band of the input signal. This makes it possible to deal with an input signal in a wide range from 1 Hz to 16 KHz, for example. As a result, an A/D conversion circuit that can be connected to various sensors can be provided.

5. Intermittent Operation of A/D Converter

In this embodiment, the sampling frequency fck1' of the A/D converter 50 is set to be the same as the sampling frequency fck1 of the SCF 40, for example. Since the sampling frequency fck2 of the digital filter 100 can be reduced, as described above, the sampling frequency fck2 can be variably set in such a range that the relationship fck1'≧fck2 is satisfied. Therefore, the A/D converter 50 can perform an intermittent operation (thinning-out operation) in which the A/D converter 50 performs the A/D conversion operation at a timing indicated by H1 in FIG. 10, does not perform the A/D conversion operation at timings indicated by H2, H3, and H4, performs the A/D conversion operation at a timing indicated by H5, and does not perform the A/D conversion operation at timings indicated by H6 and H7.

In FIG. 11, the frequency band of the input signal is 1 Hz, and the cut-off frequency fc2 of the digital filter 100 is set at 1 Hz, for example. In this case, the sampling frequency fck1' of the A/D converter 50 is set at fck1=fs1=128 KHz, for example. On the other hand, the sampling frequency fck2 of the digital filter 100 is set at fs21=2 KHz that is sufficiently lower than fck1=128 KHz. Therefore, when fck1>fck2 (i.e., fck1'>fck2), the A/D converter 50 intermittently performs the A/D conversion operation every (fck1'/fck2)=(fck1/fck2)=(128/2)=64 timings. Specifically, the A/D converter 50 performs the A/D conversion operation in a cycle of 1/64th of that of the digital filter 100. The A/D converter 50 outputs digital data obtained the intermittent A/D conversion operations to the digital filter 100.

In FIG. 12, the frequency band of the input signal is 256 Hz, and the cut-off frequency fc2 of the digital filter 100 is set at 256 Hz. The sampling frequency fck1' of the A/D converter 50 is set at fck1=128 KHz, for example. On the other hand, the sampling frequency fck2 of the digital filter 100 is set at fs23=32 KHz. Therefore, the A/D converter 50 intermittently performs the A/D conversion operation every (fck1'/fck2)=(fck1/fck2)=(128/32)=4 timings. Specifically, the A/D converter 50 performs the A/D conversion operation in a cycle of 1/4th of that of the digital filter 100.

In FIG. 13, the frequency band of the input signal is 1024 Hz, and the cut-off frequency fc2 of the digital filter 100 is set at 1024 Hz. The sampling frequency fck1' of the A/D converter 50 is set at fck1=128 KHz, for example. On the other hand, the sampling frequency fck2 of the digital filter 100 is set at fs24=128 KHz. Therefore, since (fck1'/fck2)=(fck1/fck2)=1, the A/D converter 50 performs a normal operation. Specifically, the A/D converter 50 performs the A/D conversion operation in the same cycle as that of the digital filter 100.

Figure 10:
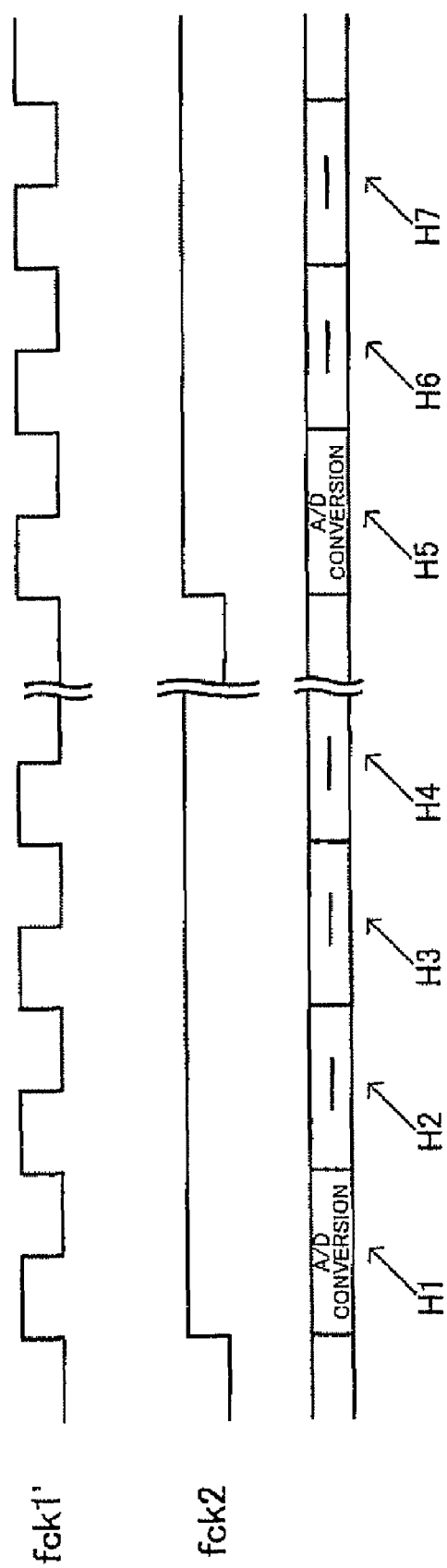
FIG. 10 is a waveform diagram illustrative of an intermittent operation of an A/D converter.

If the A/D converter 50 intermittently operates as shown in FIGS. 10 to 12, the A/D converter 50 can transition to a sleep mode in a period indicated by H2, H3, and H4 after performing the A/D conversion operation at a timing indicated by H1 in FIG. 10. Therefore, a situation in which the A/D converter 50 operates unnecessarily when the frequency band of the input signal is low to unnecessarily consume power can be prevented. Moreover, since the operation speed of the A/D converter 50 can be reduced, the A/D converter 50 can be reduced in scale.

It is also possible to provide a plurality of channels in the preceding stage of the A/D converter 50, each of the channels including the RC filter 30 and the SCF 40, and cause the A/D converter 50 to A/D-convert a signal from each channel by time division. Specifically, the A/D converter 50 A/D-converts a signal from the first channel at a timing indicated by H1 in FIG. 10, A/D-converts a signal from the second channel at a timing indicated by H2, and A/D-converts a signal from the third channel at a timing indicated by H3, for example. Therefore, a plurality of channels can be subjected to A/D conversion using one A/D converter 50 so that a multi-channel A/D conversion circuit can be implemented with a small circuit scale. Note that the sampling frequency fck1' of the A/D converter 50 need not necessarily be the same as the sampling frequency fck1 of the SCF 40. The sampling frequency fck1' of the A/D converter 50 may differ from the sampling frequency fck1 of the SCF 40. For example, the sampling frequency fck1' and the sampling frequency fck1 may have a multiplication relationship.

6. Continuous-time Filter Using Amplifier

Figure 14:
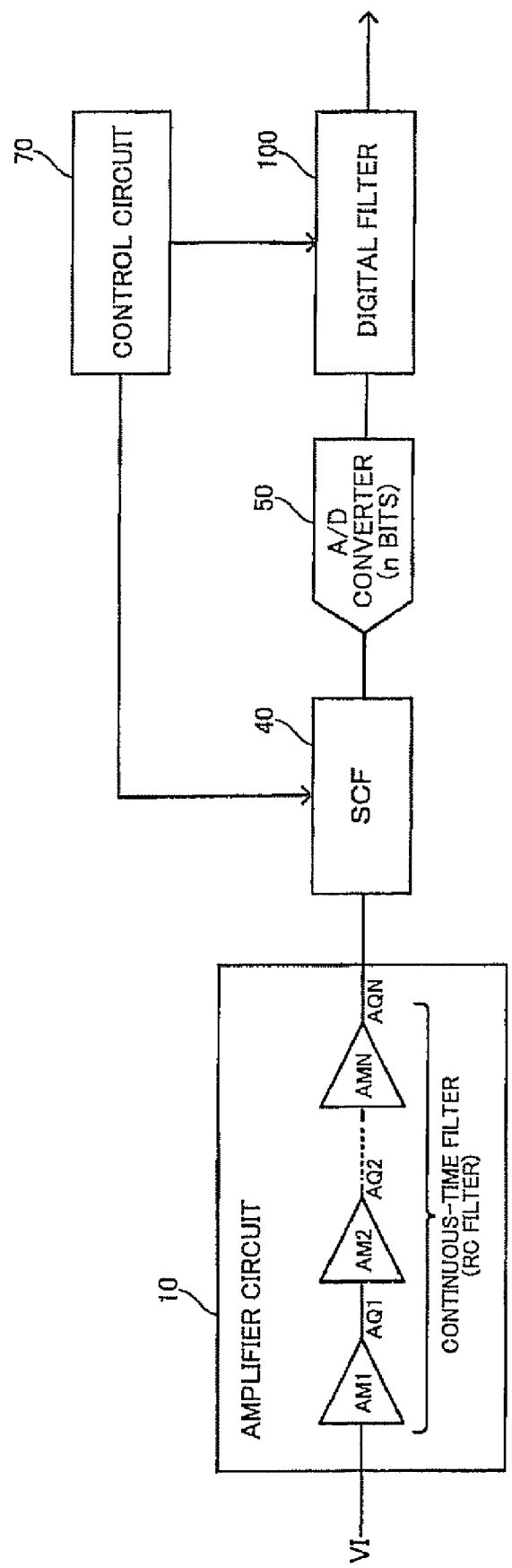
FIG. 14 is a view illustrative of a method that implements continuous-time filter using a plurality of amplifiers.

FIG. 14 shows a detailed configuration example according to this embodiment. In FIG. 14, an amplifier circuit 10 is provided in the preceding stage of the SCF 40, Note that another circuit (e.g., selector) may be provided between the SCF 40 and the amplifier circuit 10.

The amplifier circuit 10 includes a plurality of amplifiers AM1 to AMN (first to Nth amplifiers). The amplifiers AM1 to AMN are cascaded, for example. Specifically, the first amplifier AM1 receives the input signal VI from a sensor or the like, and outputs a first output signal AQ1. The second amplifier AM2 (jth amplifier in a broad sense; j is an integer that satisfies $1 < j \leq N$) receives the output signal AQ1 ((j−1)th output signal in a broad sense) from the first amplifier AM1 ((j−1)th amplifier in a broad sense), and outputs a second output signal AQ2 (jth output signal in a broad sense). The Nth amplifier AMN receives an output signal AQN−1 from the (N−1)th amplifier AMN−1, and outputs an Nth output signal AQN. The amplifiers AM1 to AMN may have a gain adjustment function and an offset adjustment function, for example. When the amplifiers AM1 to AMN have a gain adjustment function, the gains of the amplifiers AM1 to AMN may be set at a power of two. The amplifiers AM1 to AMN (subsequent-stage amplifiers) may include a plurality of inverting amplifiers. Note that a non-inverting amplifier may also be used. The first-stage amplifier AM1 may be a differential amplifier that amplifies differential input signals.

In FIG. 14, a continuous-time filter (RC filter) is formed by the amplifiers AM1 to AMN. Specifically, an active low-pass filter is formed by the amplifiers AM1 to AMN. According to this configuration, a continuous-time filter (prefilter) can be implemented by effectively utilizing the amplifier circuit 10 that amplifies the input signal. Therefore, the amplifier circuit 10 can be provided with a continuous-time filter function and an input signal amplification function. An automatic gain adjustment and an automatic offset adjustment can also be implemented by providing the amplifiers AM1 to AMN with a gain adjustment function and an offset adjustment function.

Figure 15:
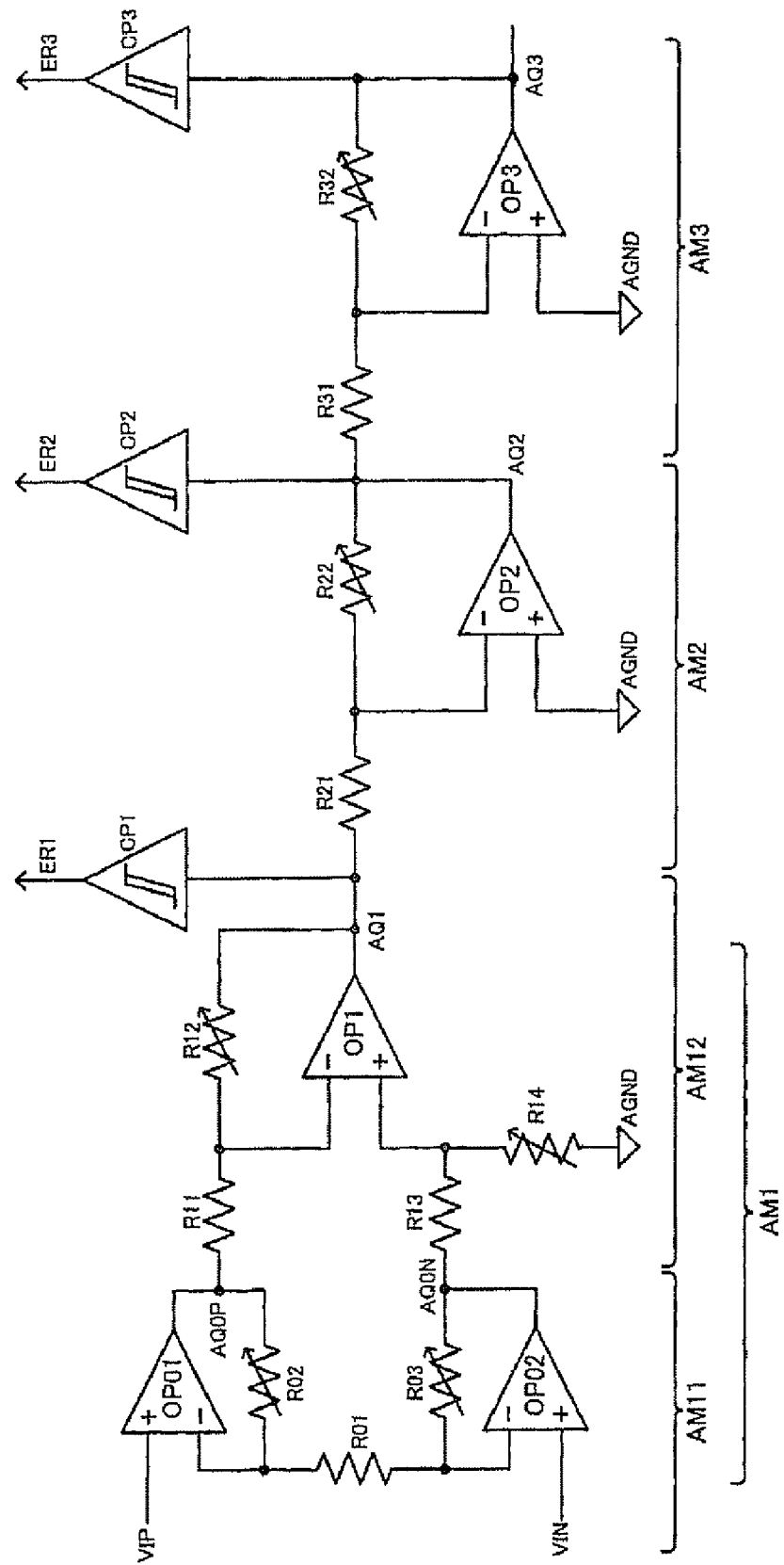
FIG. 15 shows a specific circuit configuration example of each amplifier.

FIG. 15 shows a specific circuit configuration example of the amplifiers AM1, AM2 and AM3. The amplifier AM11 includes operational amplifiers OP01 and OP02 and resistors R01, R02, and R03. The resistors R02 and R03 are variable resistors, for example. The amplifier AM12 includes operational amplifiers OP1 and resistors R11, R12, R13, and R14. The resistors R12 and R14 are variable resistors, for example. The amplifiers AM11 and AM12 form an instrumentation amplifier that utilizes the operational amplifiers OP01, OP02, and OP1. The instrumentation amplifier is a differential-input/single-ended output balanced-input amplifier. The instrumentation amplifier is characterized in that the common mode rejection ratio (CMRR) can be increased. A sensor that outputs differential detection signals and a sensor that outputs a single-ended detection signal can be connected to the first-stage differential amplifier by utilizing the instrumentation amplifier as the first-stage differential amplifier. For example, when connecting a sensor that outputs differential detection signals to the first-stage differential amplifier, a first signal (positive) that forms the differential detection signals is input as the signal VIP, and a second signal (negative) that forms the differential detection signals is input as the signal VIN. When connecting a sensor that outputs a single-ended detection signal to the first-stage differential amplifier, the single-ended detection signal is input as the signal VIP, and a VIN terminal is set at a reference analog voltage AGND, for example.

The amplifier AM2 includes an operational amplifier OP2 and resistors R21 and R22. The resistor R22 is a variable resistor, for example. The gain G2 of the amplifier AM2 is adjusted using the resistor R22. The amplifier AM3 includes an operational amplifier OP3 and resistors R31 and R32. The resistor R32 is a variable resistor, for example. The gain G3 of the amplifier AM3 is adjusted using the resistor R32. The amplifiers AM2 and AM3 are inverting amplifiers.

Specifically, the output terminal of the operational amplifier OP2 is connected to the output node of the inverting amplifier AM2. The first resistor R21 is provided between the inverting input terminal (first input terminal in a broad sense) of the operational amplifier OP2 and the input node of the inverting amplifier AM2. The second resistor R22 is provided between the output node of the inverting amplifier AM2 and the inverting input terminal of the operational amplifier OP2. The non-inverting input terminal (second input terminal in a broad sense) of the operational amplifier OP2 is set at the reference analog voltage AGND, for example. The configuration of the inverting amplifier AM3 is the same as the configuration of the inverting amplifier AM2.

It is unnecessary to use rail-to-rail operational amplifiers as the operational amplifiers OP2 and OP3 of the amplifiers AM2 and AM3 by utilizing the inverting amplifiers as the amplifiers AM2 and AM3. For example, when utilizing non-inverting amplifiers as the amplifiers AM2 and AM3, a signal having a large amplitude is distorted. It is necessary to use a rail-to-rail operational amplifier in order to prevent such a problem. However, a rail-to-rail operational amplifier has a disadvantage in that the circuit scale of the operational amplifier increases and it is difficult to improve the characteristics of the operational amplifier. The above-mentioned problems can be solved by utilizing the inverting amplifiers as the amplifiers AM2 and AM3.

Note that CP1, CP2, and CP3 indicate comparators that monitor the output signals AQ1, AQ2, and AQ3 from the amplifiers AM1, AM2, and AM3. Specifically, the comparators CP1, CP2, and CP3 respectively compare the output signals AQ1, AQ2, and AQ3 from the amplifiers AM1, AM2, and AM3 with a high-potential-side determination voltage and a low-potential-side determination voltage. The highpotential-side determination voltage is set based on the high-potential-side reference voltage that specifies the input voltage range of the A/D converter 50, and the low-potential-side determination voltage is set based on the low-potential-side reference voltage that specifies the input voltage range of the A/D converter 50. The comparators CP1, CP2, and CP3 have a hysteresis function.

Figure 16:
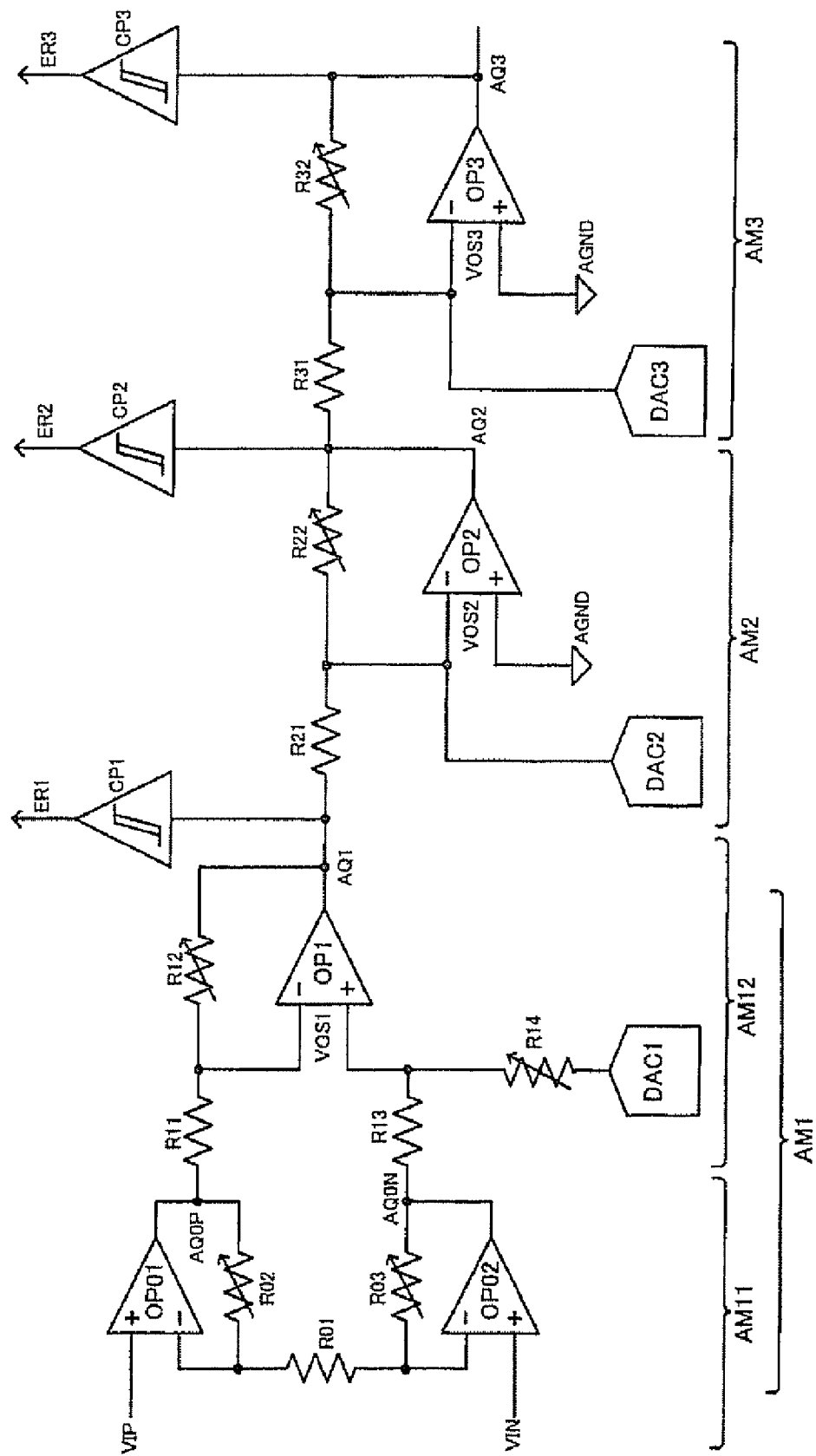
FIG. 16 shows another specific circuit configuration example of each amplifier.

FIG. 16 shows another configuration example of the amplifiers AM11, AM12, AM2, and AM3. In FIG. 16, D/A converters DAC1, DAC2, and DAC3 are provided in addition to the configuration shown in FIG. 15. The offset of the A/D conversion circuit can be adjusted by utilizing the D/A converters DAC1, DAC2, and DAC3. Specifically, an offset adjustment that cancels offset voltages VOS1, VOS2, and VOS3 of the operational amplifiers OP1, OP2, and OP3 or an offset adjustment that adjusts the DC offset of the input signal to increase the A/D conversion dynamic range can be implemented.

In this embodiment, a continuous-time filter (RC filter) is implemented by the amplifiers AM12, AM2, and AM3 shown in FIGS. 15 and 16. Specifically, the amplifier AM12 is a first-order low-pass filter having a cut-off frequency of f0. The amplifiers AM2 and AM3 are second-order low-pass filters having a cut-off frequency of f0. In the continuous-time filter formed by these amplifiers, the frequency characteristics at a frequency near the cut-off frequency are not important. Therefore, the Q value is determined so that the circuit scale decreases and the amount of attenuation in the folding band increases.

Since the amplifier circuit 10 that includes the amplifiers AM1 to AMN is provided in the preceding stage of the SCF 40, and the gain and the offset are automatically adjusted using each amplifier, a signal within an optimum voltage range is input to the A/D converter 50 even if the input signal VI that differs in amplitude and DC offset is input. Therefore, the dynamic range of the A/D conversion circuit can be increased.

In a related-art A/D conversion circuit, the amplitude and the like of the input signal have been determined to a certain extent corresponding to the specification and the like. Therefore, it suffices that the A/D conversion circuit perform an A/D conversion process within the input voltage range corresponding to the specification.

Figure 17:
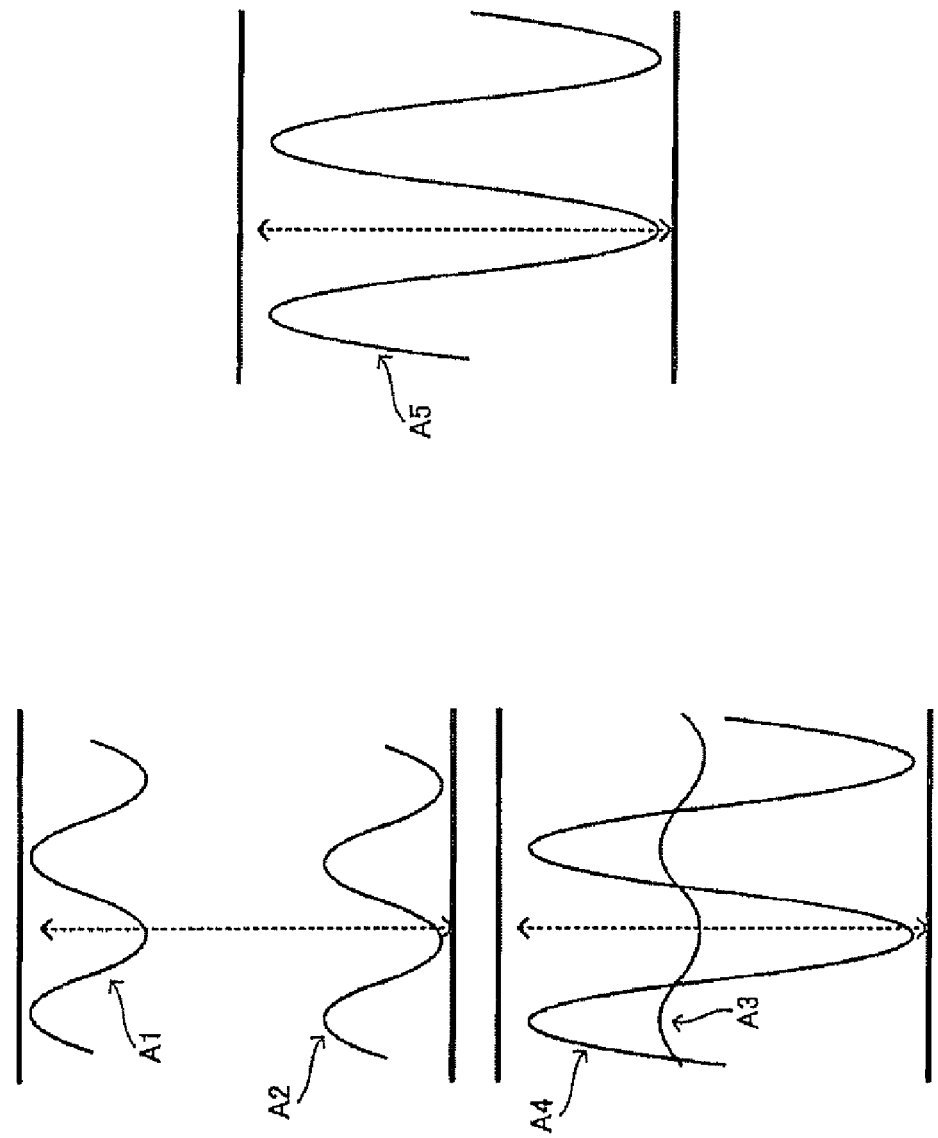
FIG. 17 is a view illustrative of a method that increases the A/D conversion dynamic range.
Figure 18:
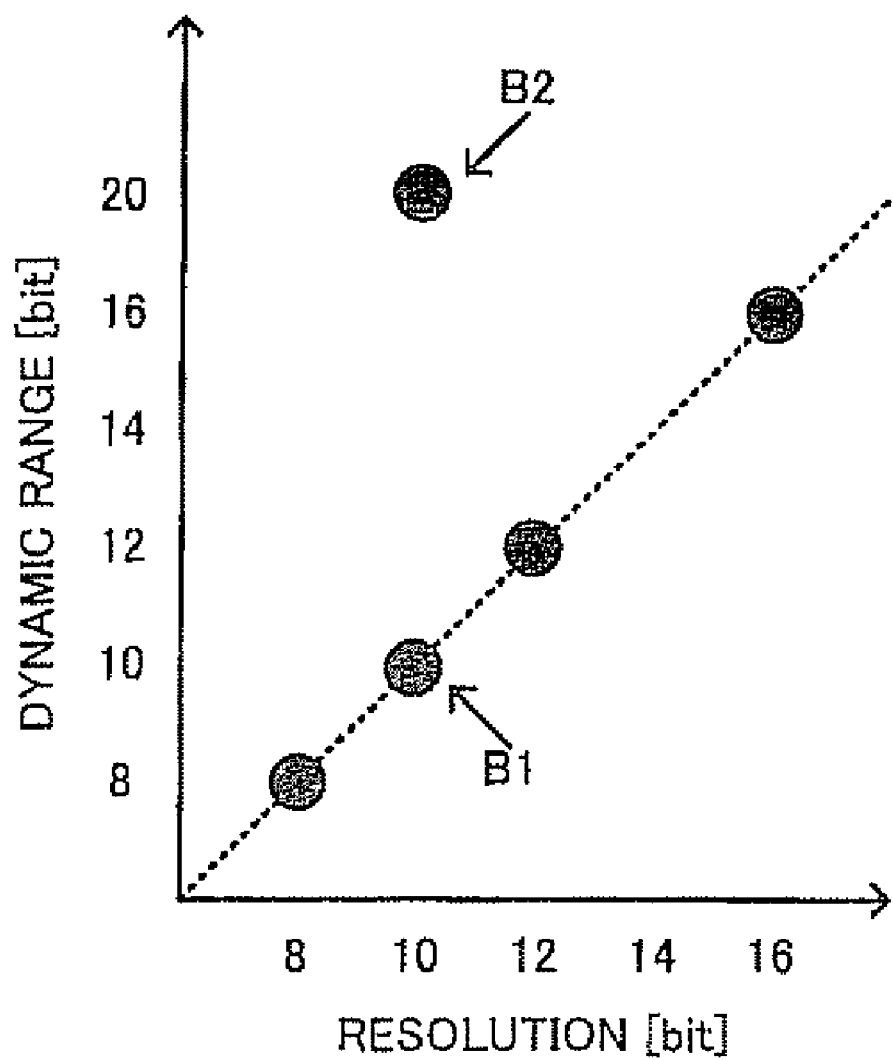
FIG. 18 is a view showing the relationship between the dynamic range and the resolution.

However, when subjecting a detection signal output from a sensor (sensor device) or the like to A/D conversion, the DC offset of the input signal VI (detection signal) differs corresponding to the type of sensor, as indicated by A1 and A2 in FIG. 17. The amplitude of the input signal VI also differs corresponding to the type of sensor, as indicated by A3 and A4. Therefore, when performing an A/D conversion process using a related-art A/D conversion circuit, the dynamic range cannot be increased without increasing the A/D conversion resolution, as indicated by B1 in FIG. 18. According to the related-art technology, the number of bits of the A/D conversion resolution is increased so that a change in the amplitude and the like of the input signal can be absorbed. However, an increase in the number of bits of the A/D conversion resolution results in an increase in circuit scale, power consumption, and the like. Moreover, the design becomes complicated.

According to the configuration shown in FIG. 14, even if the DC offset and the amplitude of the input signal VI have changed (A1, A2, A3, and A4 in FIG. 17), the A/D input amplitude (swing level) (i.e., the amplitude of the input signal input to the A/D converter 50) can be made almost constant by performing an automatic gain adjustment and an automatic offset adjustment. Therefore, the dynamic range can be significantly increased.

For example, when the A/D input amplitude (maximum input amplitude) of the A/D converter 50 is referred to as VAT, and the voltage corresponding to the 1 LSB of the A/D converter 50 is referred to as VLSB, the dynamic range DR can be expressed by DR=VAT/VLSB. According to the related-art technology, when the amplitude of the input signal VI is small (see A3 in FIG. 17), the A/D input amplitude VAT also decreases. Therefore, in order to increase the dynamic range DR (=VAT/VLSB), it is necessary to increase the number of bits of the A/D conversion resolution to reduce the voltage VLSB (see B1 in FIG. 18). As a result, an increase in the dynamic range DR is limited.

According to the configuration shown in FIG. 14, the A/D input amplitude can be increased (see A5 in FIG. 17) even if the amplitude of the input signal VI is small (see A3 in FIG. 17). Therefore, the dynamic range DR can be increased without changing the A/D conversion resolution (e.g., 10 bits) (see B2 in FIG. 18).

In the development/trial production stage of a new sensor, for example, the DC offset and the amplitude of the detection signal output from the sensor may be unknown. According to the configuration shown in FIG. 14, the user can connect the sensor to the A/D conversion circuit without taking the DC offset, the amplitude, and the frequency band of the detection signal into much consideration. Therefore, a user-friendly A/D conversion circuit can be provided. Moreover, since it is unnecessary to produce a new IC by way of trial corresponding to the type of sensor, the development cost can be reduced.

7. SCF

Figure 19A:
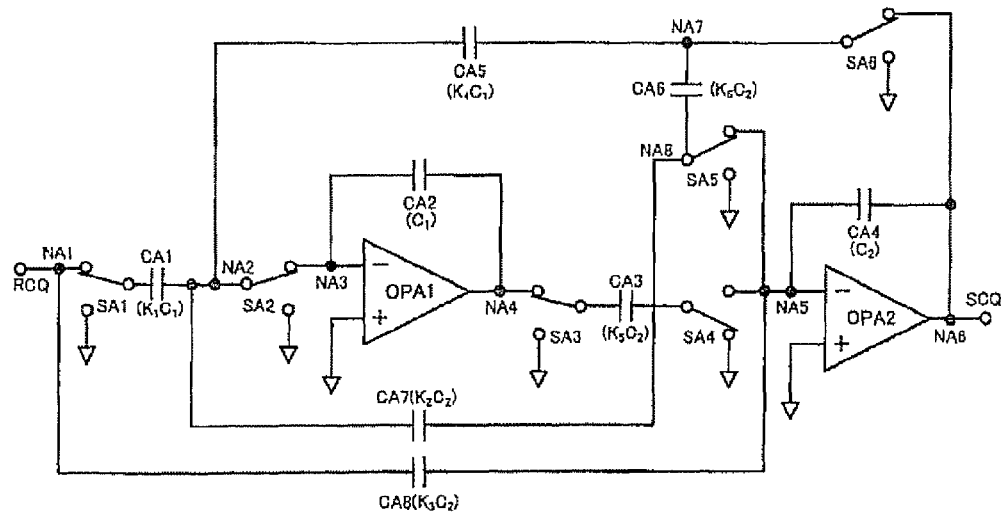
FIGS. 19A and 19B show a configuration example of an SCF.
Figure 19B:
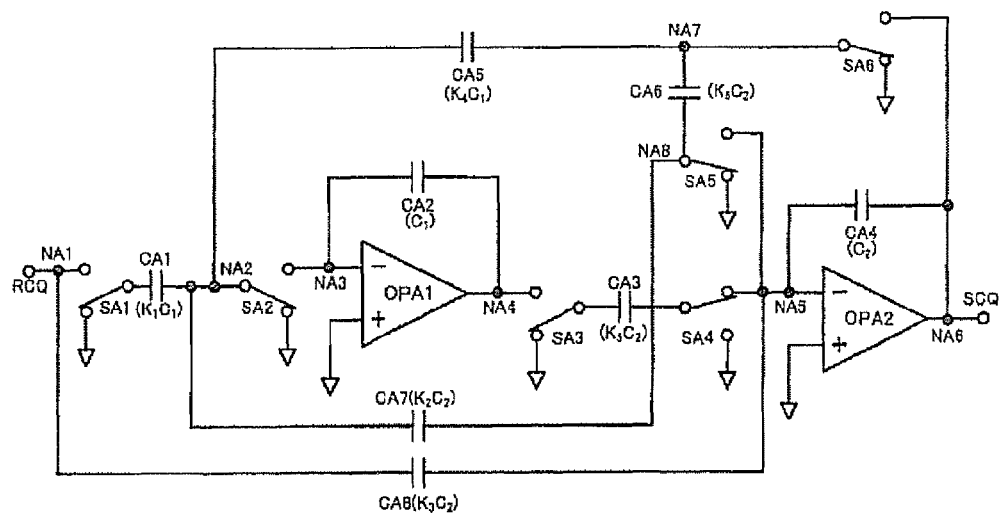

FIGS. 19A and 19B show a configuration example of the SCF 40. FIG. 19A shows a switch ON/OFF state in a sample period, and FIG. 19B shows a switch ON/OFF state in a hold period. Note that the configuration of the SCF 40 is not limited to the configuration shown in SCF 40. Various modifications may be made such as changing the elements or the connection relationship. The configuration of various types of SCF known in the art may be employed.

The SCF 40 shown in FIGS. 19A and 19B includes operational amplifiers OPA1 and OPA2, switch elements SA1 to SA6, and capacitors CA1 to CA8. The switch element SA1 and the capacitor CA1 are provided between an input node NA1 and a node NA2. The switch element SA2 is provided between a node NA2 and a node NA3 of the inverting input terminal of the operational amplifier OPA1. Note that nodes of the non-inverting input terminals of the operational amplifiers OPA1 and OPA2 are connected to the analog reference voltage AGND.

The capacitor CA2 is provided between a node NA4 of the output terminal of the operational amplifier OPA1 and the node NA3. The switch element SA3, the capacitor CA3, and the switch element SA4 are provided between the node NA4 and a node NA5 of the inverting input terminal of the operational amplifier OPA2. The capacitor CA4 is provided between a node NA6 of the output terminal of the operational amplifier OPA2 and the node NA5.

The switch element SA6, the capacitor CA6, and the capacitor CA5 are provided between a node NA7 and the nodes NA6, NA8, and NA2, respectively. The switch element SA5 and the capacitor CA7 are provided between the node NA8 and the nodes NA5 and NA2, respectively. The capacitor CA8 is provided between the node NA5 and the node NA1. According to FIGS. 19A and 19B, an SC biquad filter with a low Q value can be implemented. Note that the capacitors CA7 and CA8 may be omitted.

In this embodiment, the cut-off frequency fc1 of the SCF 40 is set based on the capacitance ratio of the capacitors CA1 to CA8 included in the SCF 40.

For example, an ideal transfer function of a continuous-time Butterworth LPF is expressed by the following expression (1).

$$HS\_id = \cfrac{1}{\cfrac{1}{4} \times \cfrac{S^2}{\pi^2 fc1^2} + \cfrac{1}{2} \times \cfrac{S\sqrt{2}}{\pi fc1} + 1} \quad (1)$$

Converting the expression (1) into a discrete-time Z function using $S=(2/T)\times\{(1-Z-1)/(1+Z-1)\}$ yields the following expression (2), for example.

$$HZ\_id = \cfrac{1}{\cfrac{fck1^2\left(1-\cfrac{1}{Z}\right)^2}{\left(1+\cfrac{1}{Z}\right)^2 \pi^2 fc1^2} + \cfrac{fck1\left(1-\cfrac{1}{Z}\right)\sqrt{2}}{\left(1+\cfrac{1}{Z}\right)\pi fc1} + 1} \quad (2)$$

When the circuit configuration of the SCF 40 shown in FIGS. 19A and 19B is expressed using a Z function, the transfer function is expressed by the following expression (3). When the capacitances of the capacitors CA2 and CA4 are referred to as $C_1$ and $C_2$, respectively, the capacitances of the capacitors CA1, CA3, CA5, CA6, CA7, and CA8 are set at $K_1C_1$, $K_5C_2$, $K_4C_1$, $K_6C_2$, $K_2C_2$, and $K_3C_2$, respectively.

$$HZ\_ans = \cfrac{(K_2 + K_3)Z^2 + (-K_2 - 2K_3 + K_5K_1)Z + K_3}{1 + (1 + K_6)Z^2 + (K_5K_4 - K_6 - 2)Z} \quad (3)$$

HZ_id=HZ_ans is solved on the assumption that HZ_id expressed by the expression (2) is equal to HZ_ans expressed by the expression (3). In this case, the sampling frequency fck1 is fixed at fs1 (see G3 in FIG. 5). Then, the coefficients $K_1$, $K_2$, $K_3$, $K_4$, $K_5$, and $K_6$ in the expression (3) when variably setting the cut-off frequency fc1 at f11, f12, f13, f14, and f15 can be obtained. Specifically, the capacitance ratio of the capacitors CA1 to CA8 used to variably set the cut-off frequency fc1 at f11, f12, f13, f14, and f15 is determined.

According to this embodiment, the cut-off frequency fc1 of the SCF 40 can be variably set by thus changing the capacitance ratio of the capacitors CA1 to CA8 while fixing the sampling frequency fck1.

Since the folding band of the SCF 40 does not change by fixing the sampling frequency fck1, the filter frequency characteristics can be easily designed. Moreover, since the capacitance ratio of the capacitors has no size dependence, the cut-off frequency can be variably set while suppressing an increase in circuit scale.

8. Digital Filter

Figure 20A:
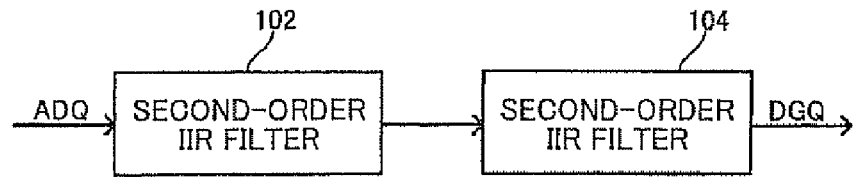
FIGS. 20A to 20C show configuration examples of a digital filter.
Figure 20B:
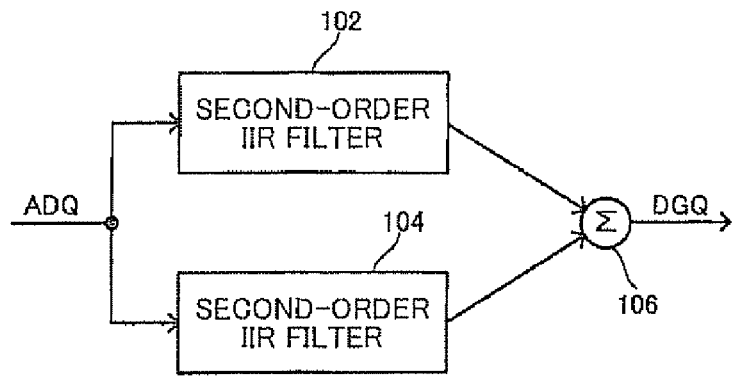

FIGS. 20A and 20B show configuration examples of the digital filter 100. In FIG. 20A, a fourth-order digital filter 100 is implemented by cascading second-order IIR filters 102 and 104. Specifically, the signal ADQ from the A/D converter 50 is input to the IIR 102, and an output signal from the IIR 102 is input to the IIR 104 in the subsequent stage. An output signal from the IIR 104 is the output signal DGQ from the digital filter 100.

In FIG. 20B, the second-order IIR filters 102 and 104 that receive the signal ADQ from the A/D converter 50 are provided in parallel. The output signals from the IIR filters 102 and 104 are summed up by an adder 106, and output as the signal DGQ.

Figure 20C:
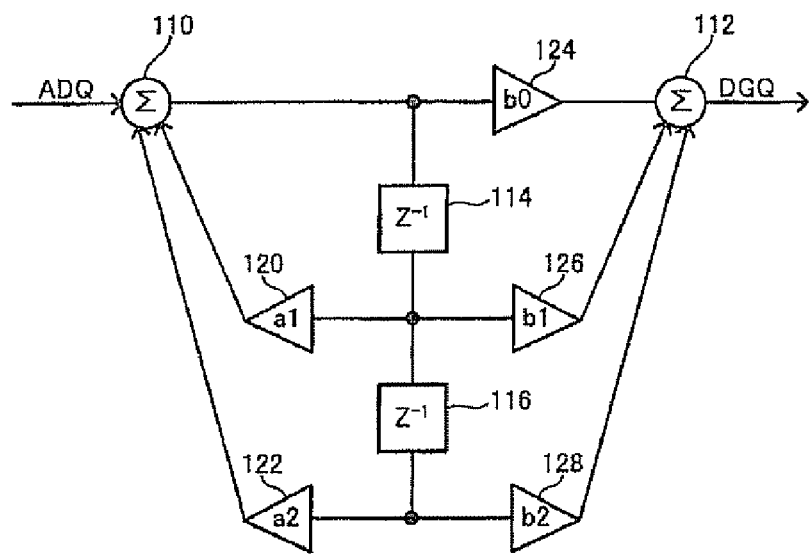

FIG. 20C shows a configuration example of each of the IIR filters 102 and 104. In FIG. 20C, delay elements 114 and 116 are implemented by a flip-flop or the like. Amplifier elements 120, 122, 124, 126, and 128 are implemented by a coefficient memory that stores a multiplication coefficient a1, a2, b0, b1, or b2 and a multiplier. Adders 110 and 112 are implemented by an addition circuit. As the actual hardware configuration, a fourth-order IIR filter can be implemented by providing a multiplier, a coefficient memory, an adder, and a plurality of registers, and performing a loop process that returns an output signal to an input, for example. Note that the configuration of the digital filter 100 is not limited to FIGS. 20A to 20C. For example, the order of the digital filter 100 may be changed, or a filter other than the IIR filter may be used.

9. Electronic Instrument

An electronic instrument according to one embodiment of the invention is described below with reference to FIGS. 21A to 21C. The electronic instrument according to this embodiment is not limited to the configurations shown in FIGS. 21A to 21C. Various modification may be made such as omitting some of the elements or adding other elements.

Figure 21A:
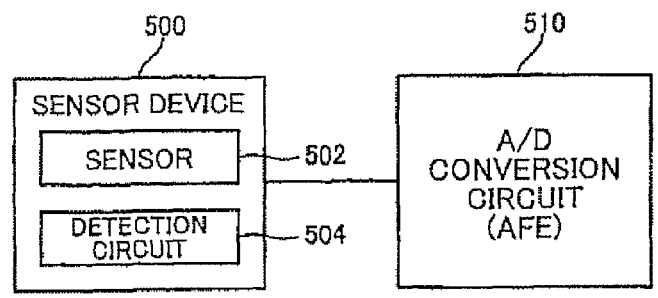
FIGS. 21A to 21C show configuration examples of an electronic instrument according to one embodiment of the invention.

FIG. 21A shows a first configuration example of the electronic instrument according to this embodiment. The electronic instrument according to the first configuration example includes a sensor device 500, and an A/D conversion circuit 510 (analog front-end (AFE) circuit) according to the above embodiment. In the electronic instrument shown in FIG. 21A, the sensor device 500 (physical quantity transducer) detects various physical quantities (e.g., force, acceleration, and mass). The sensor device 500 converts the physical quantity into a current (charge), a voltage, or the like, and outputs the current, voltage, or the like as a detection signal. The sensor device 500 includes a sensor 502 and a detection circuit 504. Note that the sensor device 500 may not include the detection circuit 504.

The A/D conversion circuit 510 receives the detection signal output from the sensor device 500, subjects the detection signal to A/D conversion, and optionally performs a calculation process (signal processing) on digital data obtained by A/D conversion. The A/D conversion circuit 510 outputs the resulting digital data to a system (system board or system device such as a CPU) in the subsequent stage.

According to the first configuration example shown in FIG. 21A, various electronic instruments that include a smoke sensor, an optical sensor, a human detection sensor, a pressure sensor, a biosensor, a gyrosensor, and the like can be implemented.

Figure 21B:
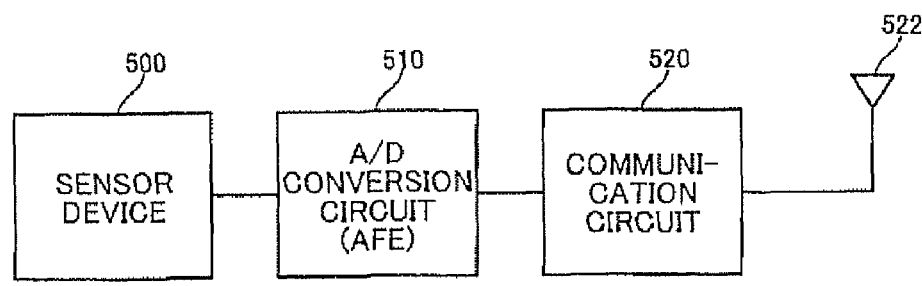

FIG. 21B shows a second configuration example of the electronic instrument according to this embodiment. In the second configuration example, a communication circuit (radio circuit) 520 and an antenna 522 are provided in addition to the first configuration example shown in FIG. 21A. The communication circuit 520 performs a modulation process and the like on the digital data output from the A/D conversion circuit 510, and transmits the resulting data to an external instrument (target-side electronic instrument) using the antenna 522. The communication circuit 520 may receive data from an external instrument using the antenna 522, and perform an ID authentication process or control the sensor device 500, for example.

According to the second configuration example shown in FIG. 21B, electronic instruments such as an IC tag (FRT. tag) used for radio frequency identification (RFID) that writes and reads data in a contactless manner utilizing wireless communication can be implemented in addition to the electronic instruments that can be implemented by the first configuration example shown in FIG. 21A, for example.

Figure 21C:
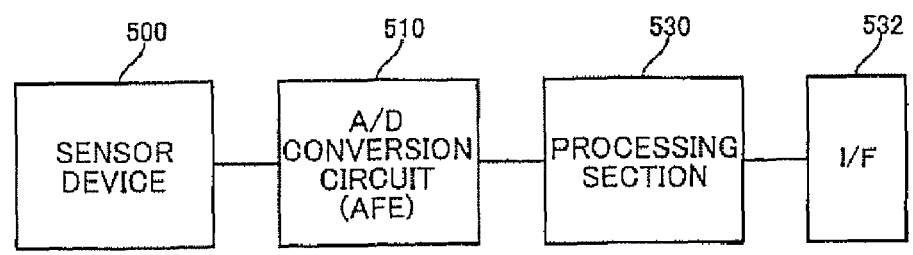

FIG. 21C shows a third configuration example of the electronic instrument according to this embodiment. The electronic instrument shown in FIG. 21C includes a processing section 530 and an interface (I/F) 532 in addition to the elements of the first configuration example shown in FIG. 21A. The processing section 530 receives the digital data output from the A/D conversion circuit 510, and performs various processes. The I/F 532 performs data transfer conforming to the USB standard, the IEEE 1394 standard, or the like to and from an external instrument such as a personal computer (PC).

According to the third configuration example shown in FIG. 21C, electronic instruments such as an evaluation device (evaluation board) used for development and trial production of the sensor device 500 can be implemented in addition to the electronic instruments that can be implemented by the first and second configuration examples shown in FIGS. 21A and 21B.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The configurations and the operations of the A/D conversion circuit and the electronic instrument are not limited to those described in the above embodiments. Various modifications and variations may be made.

What is claimed is:

1. An A/D conversion circuit comprising:
    a continuous-time filter that performs a filtering process on an input signal;
    a switched-capacitor filter that is provided in a subsequent stage of the continuous-time filter and performs a filtering process utilizing the continuous-time filter as a prefilter, a cut-off frequency of the switched-capacitor filter being variably set corresponding to a frequency band of the input signal;
    an A/D converter that is provided in a subsequent stage of the switched-capacitor filter and performs an A/D conversion operation utilizing the continuous-time filter and the switched-capacitor filter as prefilters; and
    a digital filter that is provided in a subsequent stage of the A/D converter and performs a digital filtering process utilizing the continuous-time filter and the switched-capacitor filter as prefilters, a cut-off frequency of the digital filter being variably set corresponding to the frequency band of the input signal.

2. The A/D conversion circuit as defined in claim 1, further comprising:
    a control circuit that variably sets the cut-off frequency of the switched-capacitor filter and the cut-off frequency of the digital filter.

3. The A/D conversion circuit as defined in claim 1,
    when a cut-off frequency of the continuous-time filter is referred to as fc0, the cut-off frequency of the switched-capacitor filter is referred to as fc1, and the cut-off frequency of the digital filter is referred to as fc2, the relationship fc0>fc1>fc2 being satisfied.

4. The A/D conversion circuit as defined in claim 1,
    when a sampling frequency of the switched-capacitor filter is referred to as fck1, the cut-off frequency of the switched-capacitor filter is referred to as fc1, a resolution of the A/D converter is n bits, and an attenuation factor of the continuous-time filter at a frequency fck1-fc1 is AT1 dB, the relationship AT1≦20×log(½$^n$) being satisfied.

5. The A/D conversion circuit as defined in claim 4,
    when a sampling frequency of the digital filter is referred to as fck2, the cut-off frequency of the digital filter is referred to as fc2, and a resultant attenuation factor of the continuous-time filter and the switched-capacitor filter at a frequency fck2-fc2 is AT2 dB, the relationship AT2≦20×log(½$^n$) being satisfied.

6. The A/D conversion circuit as defined in claim 1,
    a cut-off frequency fc0 of the continuous-time filter being fixed; and
    the cut-off frequency fc1 of the switched-capacitor filter and the cut-off frequency fc2 of the digital filter being variably set.

7. The A/D conversion circuit as defined in claim 1
    a sampling frequency fck1 of the switched-capacitor filter being fixed; and the cut-off frequency fc1 of the switched-capacitor filter being variably set.

8. The A/D conversion circuit as defined in claim 7,
    the cut-off frequency fc1 of the switched-capacitor filter being variably set by changing a capacitance ratio of a plurality of capacitors included in the switched-capacitor filter.

9. The A/D conversion circuit as defined in claim 1,
    a sampling frequency fck2 and the cut-off frequency fc2 of the digital filter being variably set.

10. The A/D conversion circuit as defined in claim 9,
    the sampling frequency fck2 of the digital filter being set so that the sampling frequency fck2 decreases as the cut-off frequency fc1 of the switched-capacitor filter decreases.

11. The A/D conversion circuit as defined in claim 10,
    the cut-off frequency fc2 of the digital filter being set so that the cut-off frequency fc2 decreases as the frequency band of the input signal decreases.

12. The A/D conversion circuit as defined in claim 1,
    when a sampling frequency of the A/D converter is referred to as fck1', a sampling frequency fck2 of the digital filter being variably set in such a range that the relationship fck1'≧fck2 is satisfied.

13. The A/D conversion circuit as defined in claim 12,
    the A/D converter intermittently performing the A/D conversion operation every (fck1'/fck2) timings when fck1'>fck2, and outputting digital data obtained by the intermittent A/D conversion operations to the digital filter.

14. The A/D conversion circuit as defined in claim 1, further comprising:
    an amplifier circuit that includes a plurality of amplifiers that are cascaded, the amplifier circuit being provided in a preceding stage of the switched-capacitor filter and receiving the input signal,
    the continuous-time filter being formed by the plurality of amplifiers of the amplifier circuit.

15. An electronic instrument comprising the A/D conversion circuit as defined in claim 1.

* * * * *